United States Patent
Wang et al.

(10) Patent No.: US 11,818,851 B2
(45) Date of Patent: Nov. 14, 2023

(54) FOLDABLE APPARATUS FOR FOLDABLE DEVICE

(71) Applicant: EVOLUTIVE LABS CO., LTD., Taipei (TW)

(72) Inventors: Ching-Fu Wang, Taipei (TW); Sheng-Che Su, Taipei (TW); Po-Wen Hsiao, Taipei (TW); Chia-Ho Lin, Taipei (TW)

(73) Assignee: EVOLUTIVE LABS CO., LTD., Taipei (TW)

( * ) Notice: Subject to any disclaimer, the term of this patent is extended or adjusted under 35 U.S.C. 154(b) by 265 days.

(21) Appl. No.: 16/863,150

(22) Filed: Apr. 30, 2020

(65) Prior Publication Data
US 2020/0352045 A1 Nov. 5, 2020

Related U.S. Application Data

(60) Provisional application No. 62/842,949, filed on May 3, 2019.

(51) Int. Cl.
| | |
|---|---|
| *H05K 5/02* | (2006.01) |
| *A45C 11/00* | (2006.01) |
| *A45C 13/00* | (2006.01) |
| *H05K 5/00* | (2006.01) |

(52) U.S. Cl.
CPC ............ *H05K 5/0226* (2013.01); *A45C 11/00* (2013.01); *A45C 13/005* (2013.01); *A45C 2011/002* (2013.01); *H05K 5/0017* (2013.01)

(58) Field of Classification Search
CPC ....... A45C 11/00; A45C 13/00; A45C 13/005; A45C 2011/002; G01L 5/00; H04M 1/02; H04M 1/18; H05K 5/00; H05K 5/0017; H05K 5/02; H05K 5/0226; H05K 5/03; G06F 1/16; G06F 1/1616; G06F 1/1632; G06F 1/1681
USPC .................................................. 206/305, 320
See application file for complete search history.

(56) References Cited

U.S. PATENT DOCUMENTS

| | | | | |
|---|---|---|---|---|
| 7,354,639 | B2* | 4/2008 | Durney ................ | H05K 1/0278 |
| | | | | 428/130 |
| 8,834,337 | B2* | 9/2014 | Hannum ................ | B21D 11/08 |
| | | | | 493/405 |
| 9,176,535 | B2* | 11/2015 | Bohn .................... | G06F 1/1652 |
| 9,354,476 | B2* | 5/2016 | Han ...................... | G06F 1/1616 |
| 10,064,298 | B2* | 8/2018 | Cavenagh ............ | H05K 5/0004 |
| 10,297,785 | B2* | 5/2019 | Ahn ...................... | H05K 1/028 |
| 10,345,856 | B2* | 7/2019 | Song .................... | H05K 5/0017 |
| 10,466,747 | B2* | 11/2019 | Yun ...................... | H05K 5/0226 |
| 10,540,026 | B2* | 1/2020 | Park ...................... | G06F 1/1652 |

(Continued)

FOREIGN PATENT DOCUMENTS

WO   WO-2018152970 A1 *   8/2018   .............. G01L 5/00

*Primary Examiner* — Bryon P Gehman
(74) *Attorney, Agent, or Firm* — WPAT LAW; Anthony King

(57) ABSTRACT

The present disclosure provides a foldable apparatus for receiving a foldable device. The foldable apparatus includes a casing for receiving the foldable device. The casing includes a body and a bending zone. The body is for providing an accommodation to the foldable device. The bending zone is for folding the body from an unfolded position to a folded position. The bending zone includes a stress relaxation structure for retaining the body in the folded position and reversing the body to the unfolded position.

6 Claims, 24 Drawing Sheets

(56) References Cited

U.S. PATENT DOCUMENTS

| | | | |
|---|---|---|---|
| 10,645,827 B2* | 5/2020 | Fan | G06F 1/1615 |
| 10,694,623 B2* | 6/2020 | Park | H05K 5/0226 |
| 10,727,435 B2* | 7/2020 | Kim | H05K 5/0226 |
| 2013/0216740 A1* | 8/2013 | Russell-Clarke | B23K 26/38 |
| | | | 428/34.1 |
| 2016/0014914 A1* | 1/2016 | Stroetmann | H05K 5/0021 |
| | | | 312/223.1 |

* cited by examiner

FOLDABLE APPARATUS FOR FOLDABLE DEVICE

PRIORITY CLAIM AND CROSS-REFERENCE

This application claims priority of U.S. provisional application Ser. No. 62/842,949 filed on May 3, 2019, which is incorporated by reference in its entirety.

TECHNICAL FIELD

The present disclosure relates generally to a foldable apparatus, more particularly, to a foldable apparatus for a foldable device.

DISCUSSION OF THE BACKGROUND

Flexible, foldable and/or stretchable electronics are emerging as an attractive and promising new industry. Such electronics, such as flexible displays and stretchable circuits, can be incorporated into some device, e.g., handheld devices, smart phones and wearable devices.

However, the conventional foldable apparatus for securing such devices are not well developed. For instance, the protection of some conventional foldable apparatus may be insufficient due to the design defects, or some conventional foldable apparatus may not effectively relieve residual mechanical stress when being folded or unfolded.

SUMMARY

Some embodiments of the present disclosure provide a foldable apparatus for receiving a foldable device. The foldable apparatus includes a casing for receiving the foldable device. The casing includes a body and a bending zone. The body is for providing an accommodation to the foldable device. The bending zone is for folding the body from an unfolded position to a folded position. The bending zone includes a stress relaxation structure for retaining the body in the folded position and reversing the body to the unfolded position.

Some embodiments of the present disclosure provide a foldable apparatus. The foldable apparatus includes a frame for receiving a foldable device. The frame includes a flexible structure for folding the frame. The flexible structure includes a first element and a second element. A plurality of first recesses is formed on the first element. A plurality of second recesses is formed on the second element.

Some embodiments of the present disclosure provide a foldable apparatus for receiving a foldable device. The foldable apparatus includes a casing for receiving the foldable device. The casing includes a first portion and a second portion. The first portion of the casing is structured to provide an accommodation to the foldable device. The second portion is a bending area for the first portion while being folded from an unfolded position to a folded position. The second portion is designed to have a stress relaxation structure in order to retain the folded position and reverse the first portion to the unfolded position.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures.

FIGS. 3H and 3I are side views of the flexible structure of the foldable apparatus according to some embodiments of the present disclosure.

DETAILED DESCRIPTION

Figure 1A:
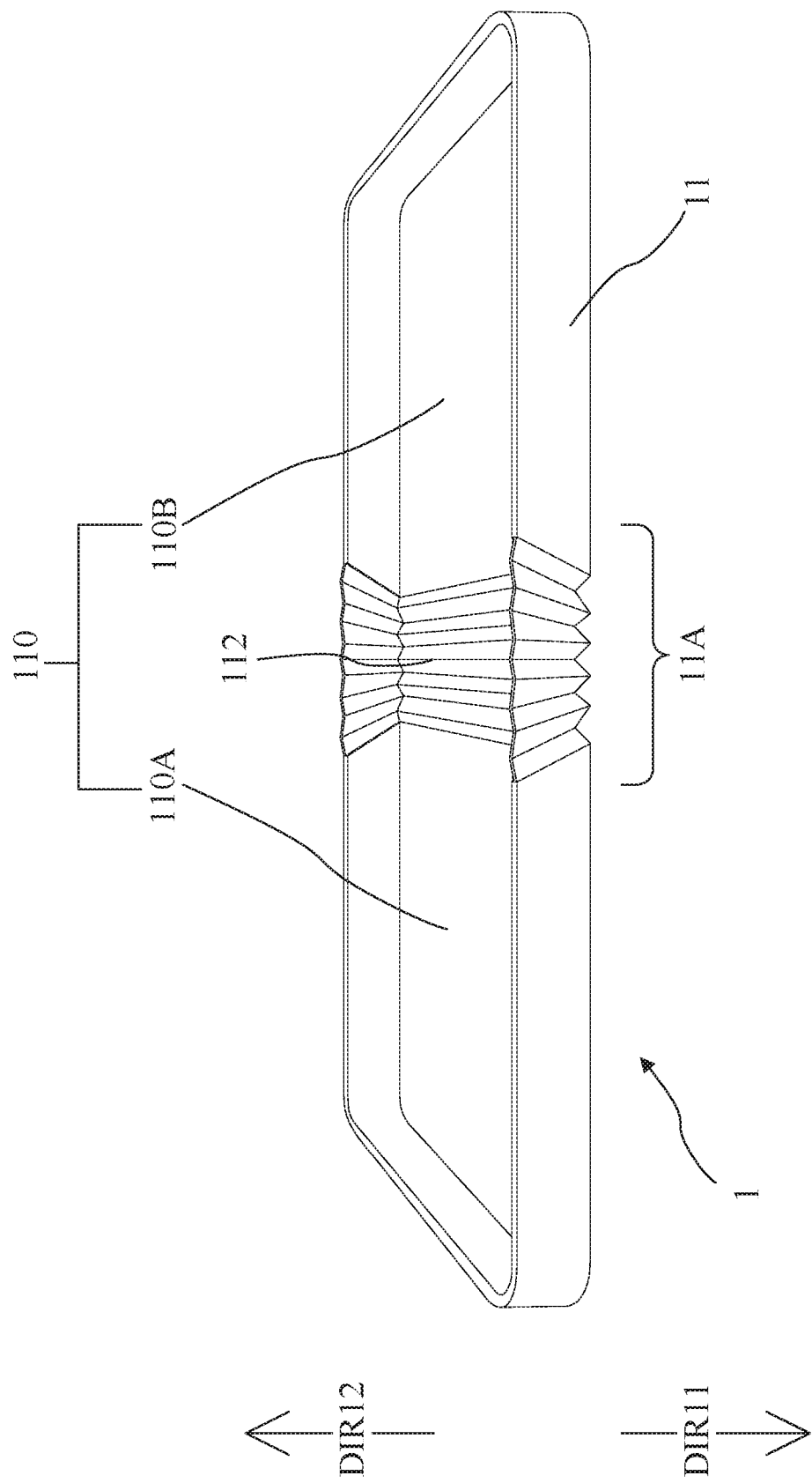
FIG. 1A is a schematic drawing of a foldable apparatus 1 in an unfolded position. according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Flexible, foldable and/or stretchable electronics are emerging as an attractive and promising new industry. Such electronics, such as flexible displays and stretchable circuits, could be incorporated into smart phones and wearable devices.

However, the conventional foldable apparatus for securing devices with foldable electronics are not well developed. For example, the protection of some conventional foldable apparatus may be insufficient due to the design defects, or some conventional foldable apparatus may not effectively relieve residual mechanical stress when being folded or unfolded, thereby having lower durability of being repeating folding, thus deteriorating the reliability of the foldable structure. The foldable structure may further noticeably deformed or the flexibility of the foldable structure may decay.

In addition, such conventional foldable structures may influence user experience due to the unstable folding position, such as folding in an undesirable fashion. Accordingly, it is entailed in the art for foldable apparatus which may utilize a foldable structure design to ameliorate mechanical stress thereof, improve reliability and providing a stable folding position.

Figure 1B:
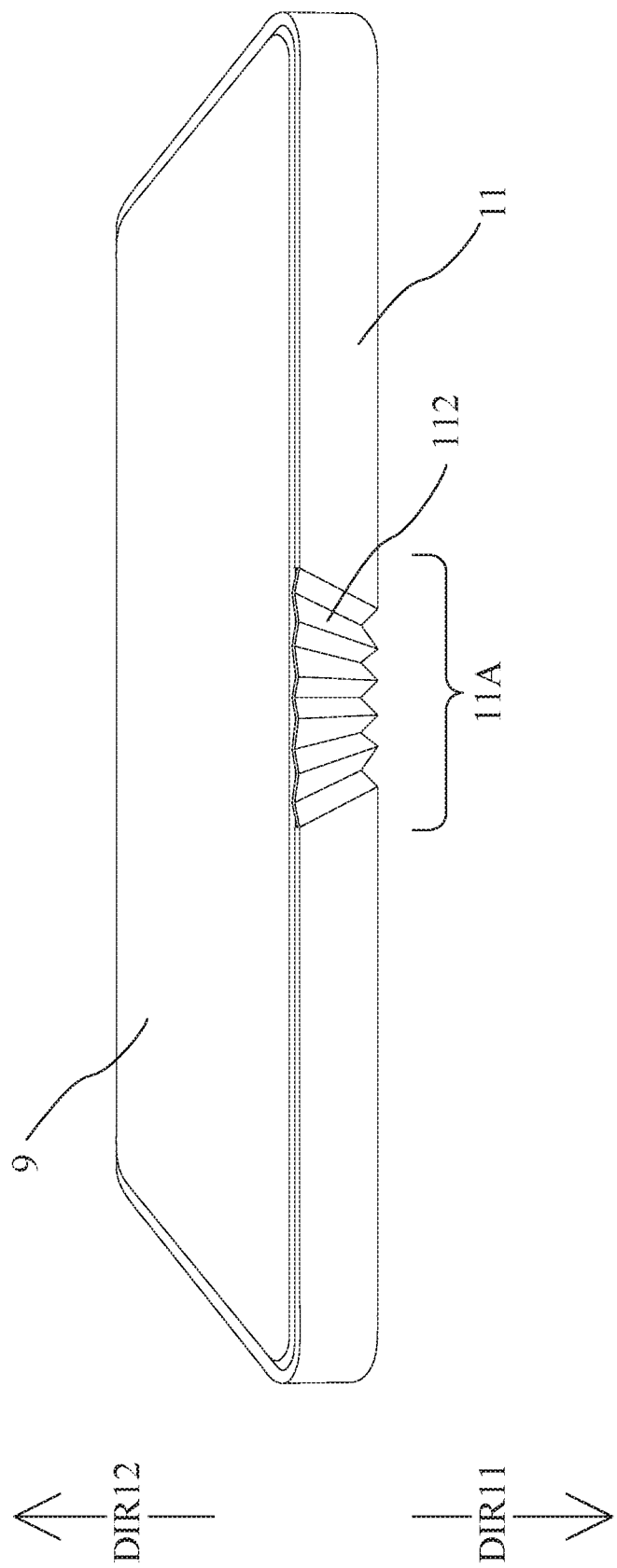
FIG. 1B is a schematic drawing of the foldable apparatus with a foldable device in the unfolded position according to some embodiments of the present disclosure.
Figure 1C:
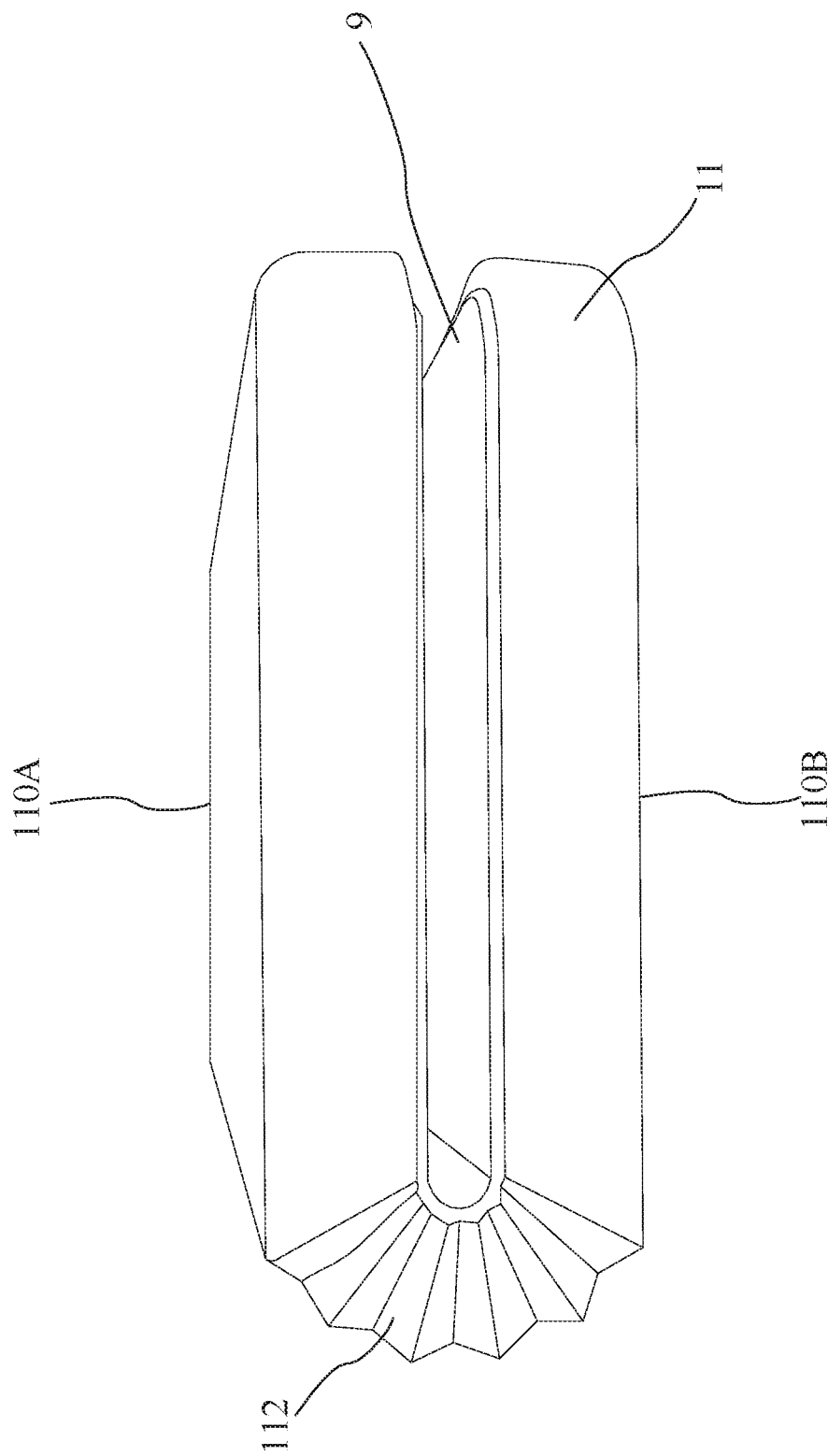
FIG. 1C is a schematic drawing of the foldable apparatus with the foldable device in a folded position according to some embodiments of the present disclosure.

Please refer to FIG. 1A to FIG. 1C. FIG. 1A is a schematic drawing of a foldable apparatus 1 in an unfolded position. FIG. 1B is a schematic drawing of the foldable apparatus 1 with a foldable device 9 in the unfolded position. FIG. 1C is a schematic drawing of the foldable apparatus 1 with the foldable device 9 in a folded position.

In some embodiments, the foldable apparatus 1 may include a casing 11, and the casing 11 may include a body 110 and a bending zone 11A. The casing 11 may receive the foldable device 9 (e.g., flexible devices, display devices, flexible panels, electronic devices, mobile, communication devices, or the like). Particularly, the body 110 of the casing 11 may provide an accommodation to receive the foldable device 9.

In some embodiments, the foldable device 9 may be assembled into the foldable apparatus 1 along a direction DIR11. After assembling the foldable device 9 into the foldable apparatus 1, a display of the foldable device 9 may face toward a direction DIR12 which is opposite to the direction DIR11.

In some embodiments, the bending zone 11A may be utilized for folding the body 110 from the unfolded position (shown in FIG. 1B) to the folded position (shown in FIG. 1C), or unfolding the body 110 from the folded position to the unfolded position. In some implementations, the bending zone 11A may correspond to a joint of the foldable device 9 received in the casing 11 so that the body 110 of the casing 11 may be folded or unfolded with the folding operation or unfolding operation of the foldable device 9.

More specifically, in some embodiments, the body 110 may include a first part 110A and a second part 110B. The bending zone 11A may include a stress relaxation structure 112. The stress relaxation structure 112 may connect the first part 110A and the second part 110B. In some implementations, the stress relaxation structure 112, the first part 110A and the second part 110B may be integrally molded.

When the body 110 is in the folded position, the stress relaxation structure 112 may be utilized for retaining the body 110 in the folded position. When the body 110 is released from the folded position, the stress relaxation structure 112 may be utilized for reversing the body 110 to the unfolded position.

Figure 1D:
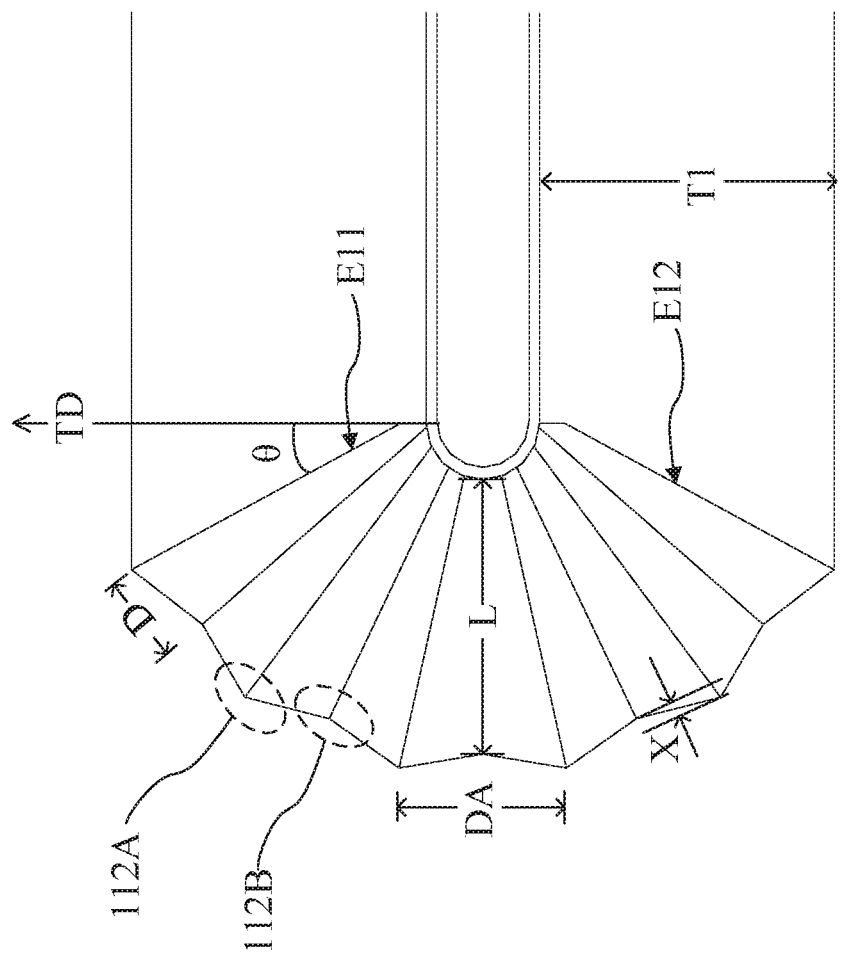
FIG. 1D is a partial enlargement view of the stress relaxation structure according to some embodiments of the present disclosure.

Referring to FIG. 1D, which is a partial enlargement view of the stress relaxation structure 112. In some embodiments, the stress relaxation structure 112 may include a bellow structure. In particular, the bellow structure may include a plurality of convex portions 112A and a plurality of concave portions 112B. The convex portions 112A and the concave portions 112B may be connected alternately.

In some embodiments, an elongation of the stress relaxation structure 112 may be decreased while the stress applied on the stress relaxation structure 112 is decreased for unfolding the foldable apparatus 1, and distances DA between adjacent convex portions 112A may be decreased accordingly. The elongation of the stress relaxation structure 112 may be increased while the stress applied on the stress relaxation structure 112 is increased for folding the foldable apparatus 1, and distances DA between adjacent convex portions 112A may be increased accordingly.

Accordingly, the risk of inducing rupturing, hardening, loosening, necking, and/or permanent deformation of the casing 11 of the foldable apparatus 1 may be lowered by lowering the strain induced during folding, unfolding, and the cyclic action of folding and unfolding with the stress relaxation structure 112.

Figure 1E:
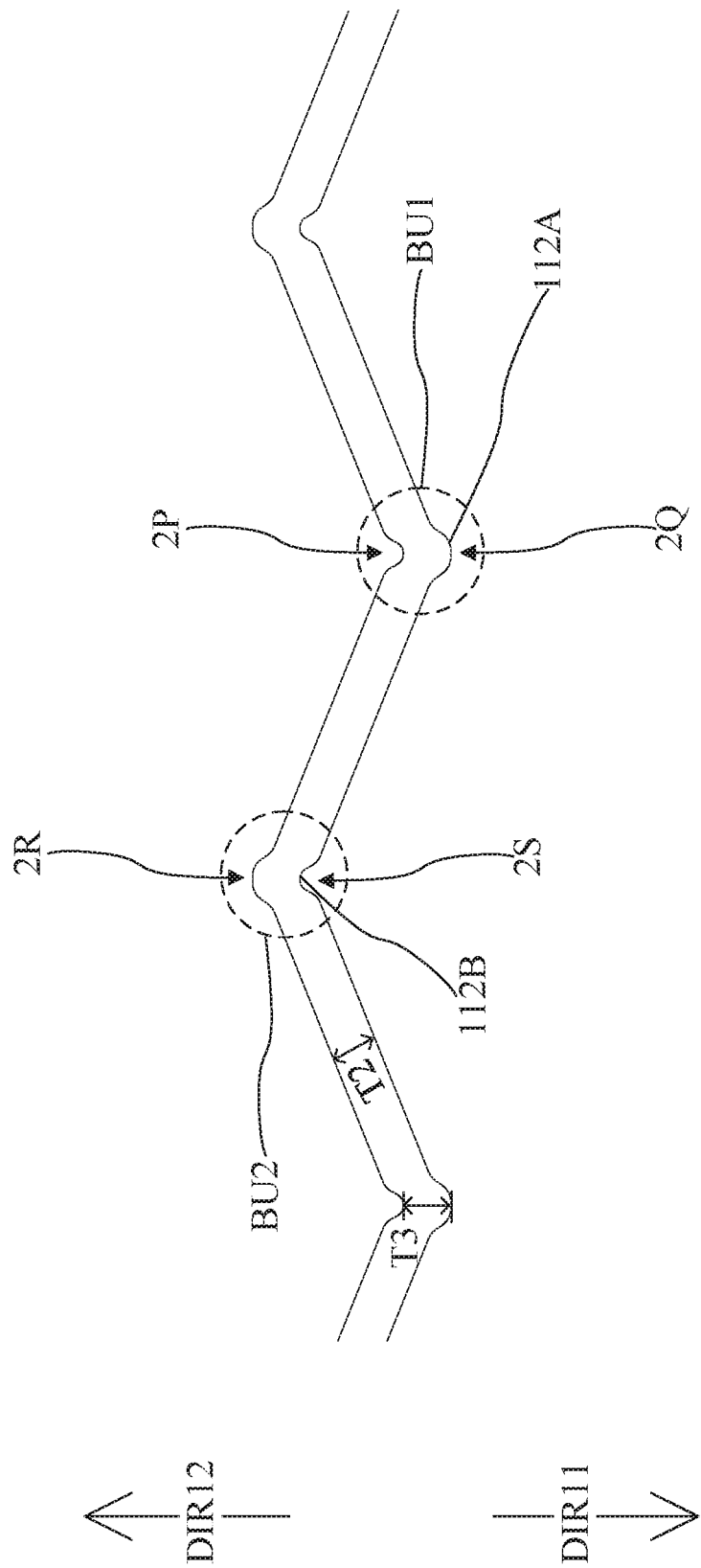
FIG. 1E is a cross-section view of the stress relaxation structure according to some embodiments of the present disclosure.

Please refer to FIG. 1E together. FIG. 1E is a cross-section view of the stress relaxation structure 112. In some embodiments, when the foldable apparatus 1 is in the unfolded position, the convex portion 112A may have an outer side 2Q facing toward the direction DIR11 and an inner side 2P facing toward the direction DIR12. The outer side 2Q and the inner side 2P may cooperatively form a buffer BU protruding toward the direction DIR11.

The concave portion 112B may have an outer side 2S facing toward the direction DIR11 and an inner side 2R facing toward the direction DIR12. The outer portion 2S and the inner portion 2R may cooperatively form a buffer BU2 protruding toward the direction DIR12.

Particularly, the convex portion 112A and the concave portion 112B may be configured to be bent. In order to decrease the effect of stress concentration, buffer BU1 and BU2 configured on the convex portion 112A and the concave portion 112B may alleviate stress concentration under folding position and avoid deteriorate of failure. In addition, by configuring the convex portions 112A and the concave portions 112B of the stress relaxation structure 2, stress applied on each of the convex portions 112A and the concave portions 112B may be decreased.

In some embodiments, in order to alleviate stress concentration under folding, unfolding, or during the cycle of folding and unfolding, some factors of the design may be under consideration.

In some implementations, the factors of the design may include: (a) an angle θ is between a thickness direction TD of the casing 11 and an edge E11 defined between the stress relaxation structure 112 and the body 110; (b) a thickness T1 of the body 110 of the casing 11; (c) a distance L of the stress relaxation structure 2 from one concave portion 112B to the opposite side; (d) a height difference X between one concave portion 112B and the adjacent convex portion 112A (may be measured in the folded position, the unfolded position, an intermediate stage of folding, or an intermediate stage during fabrication); (e) a distance D between one concave portion 112B and the adjacent convex portion 112A; (f) a thickness T2 of the stress relaxation structure 2; (g) a thickness T3 of a portion connecting the convex portion 112A and the concave portion 112B.

It is noteworthy that the factors are not limited thereto; other factors pertinent to geometrical features or the properties of the materials entailed herein are also under consideration of designing.

In some embodiments, thickness of the stress relaxation structure 112 may, or may not be non-uniform. In some implementations, the thickness T2 at the convex portion 112A or the concave portion 112B may be different from the thickness T3 of the portion connecting the convex portion 112A and the concave portion 112B.

In some embodiments, the bending zone 11A of the foldable apparatus for disposing the stress relaxation structure 112 may be from the edge E11 of the casing 11 to another edge E12 of the casing 11. In some embodiments, most part of the casing 11 may be configured to be the bending zone 11A to provide more variations of folding or bending.

In some embodiments, a portion of an inner side of the casing 11 may have a height difference (not shown) to enhance the efficiency of molding/die casting/tooling during manufacturing operation.

Figure 2A:
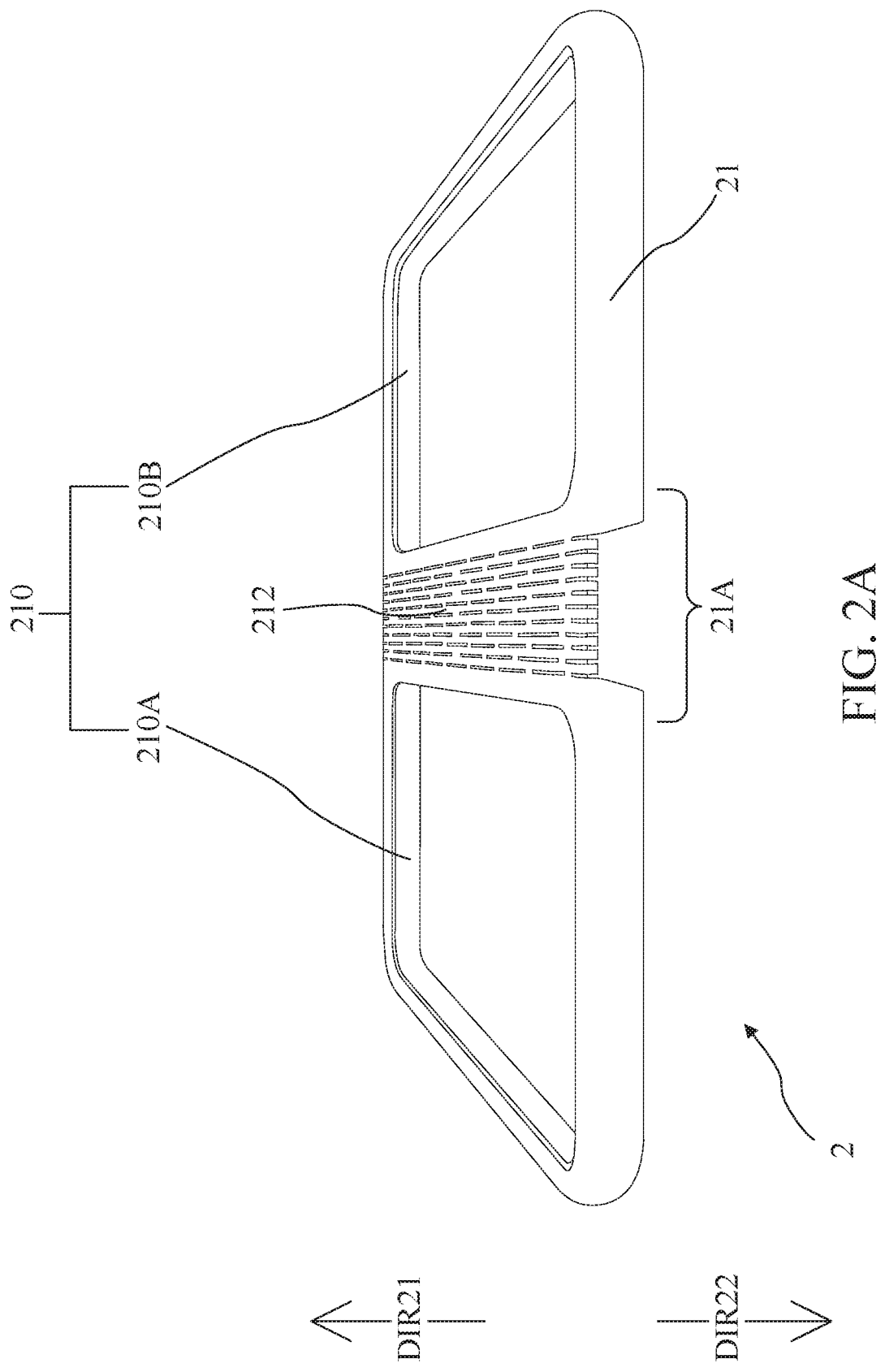
FIG. 2A is a schematic drawing of a foldable apparatus in an unfolded position according to some embodiments of the present disclosure.
Figure 2B:
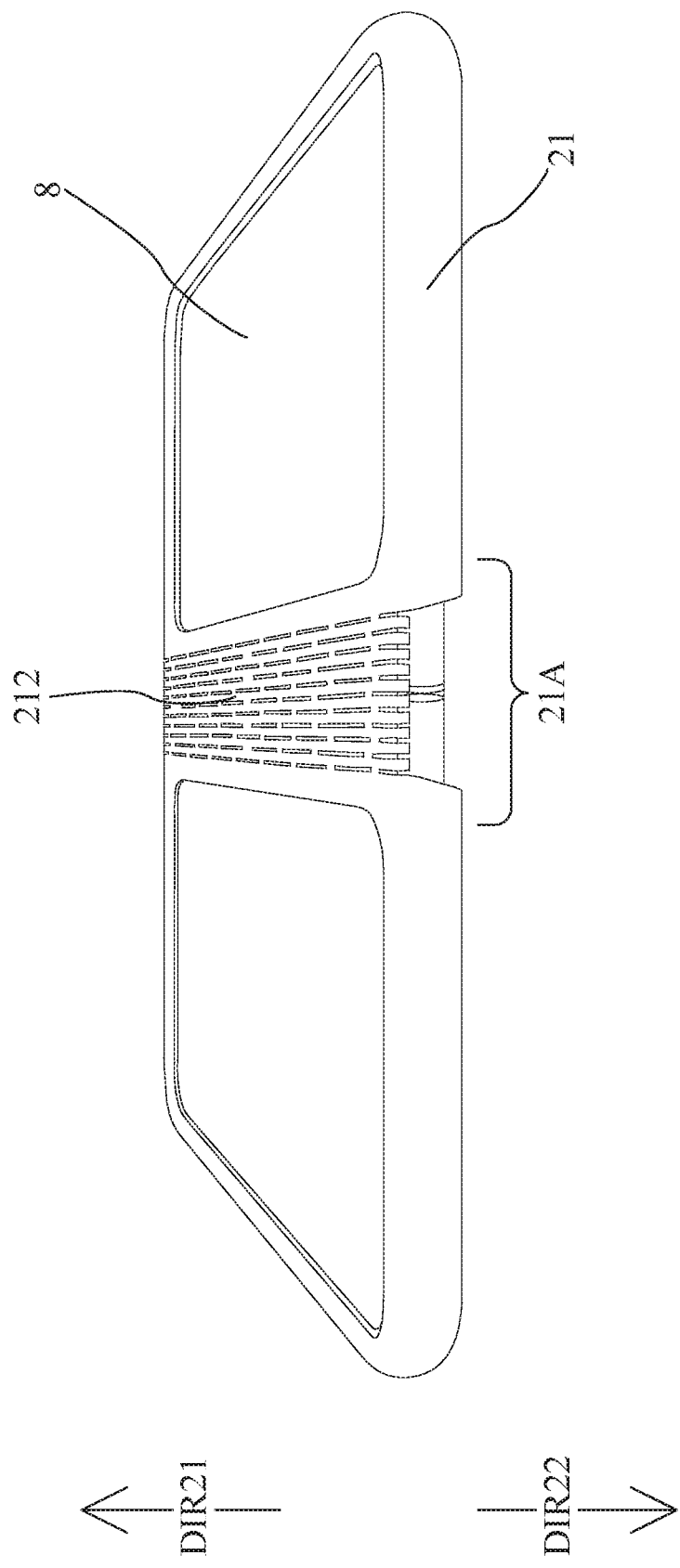
FIGS. 2B and 2C are schematic drawings of the foldable apparatus with a foldable device in the unfolded position according to some embodiments of the present disclosure.
Figure 2C:
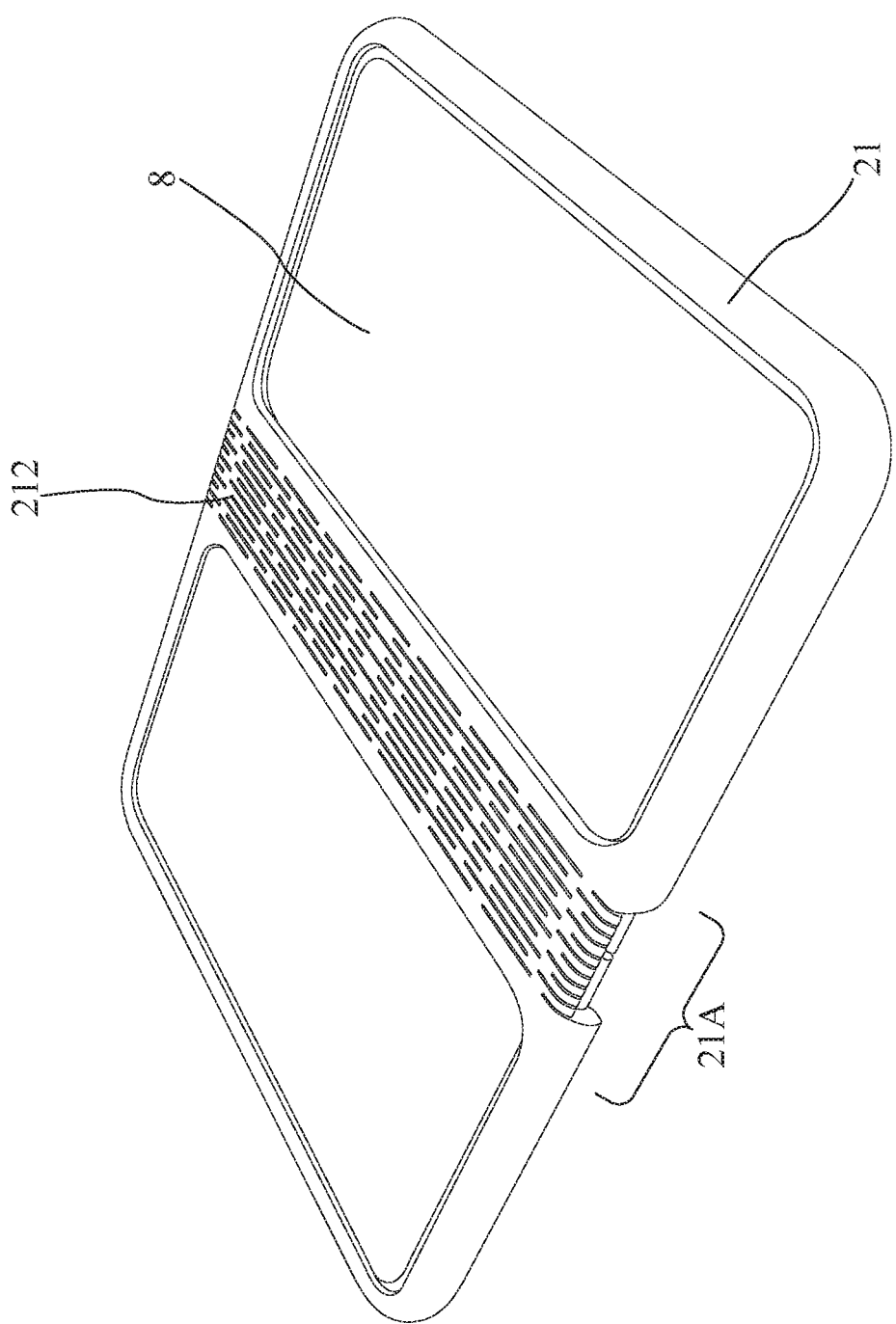
Figure 2D:
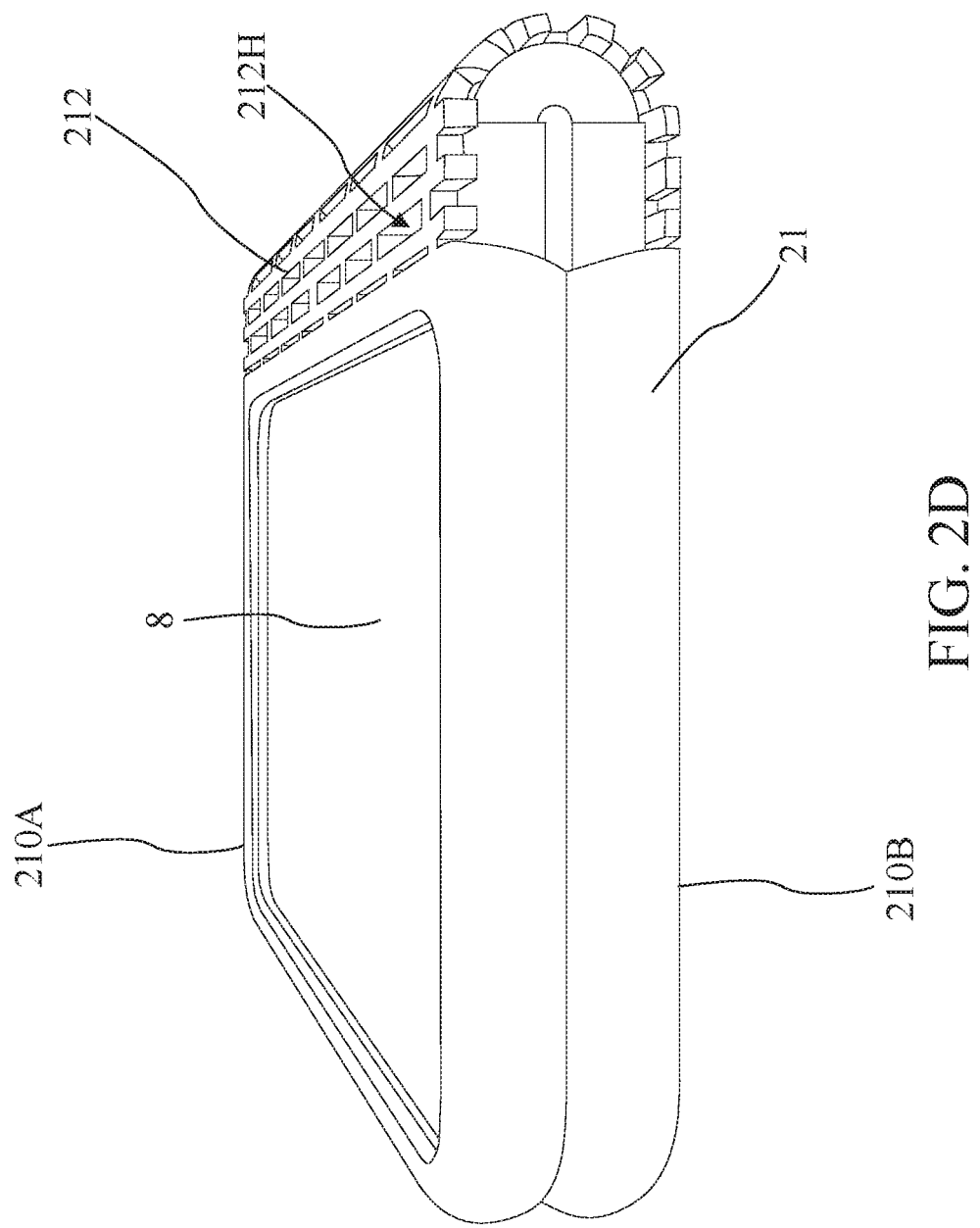
FIGS. 2D and 2E are schematic drawings of the foldable apparatus with the foldable device in a folded position according to some embodiments of the present disclosure.
Figure 2E:
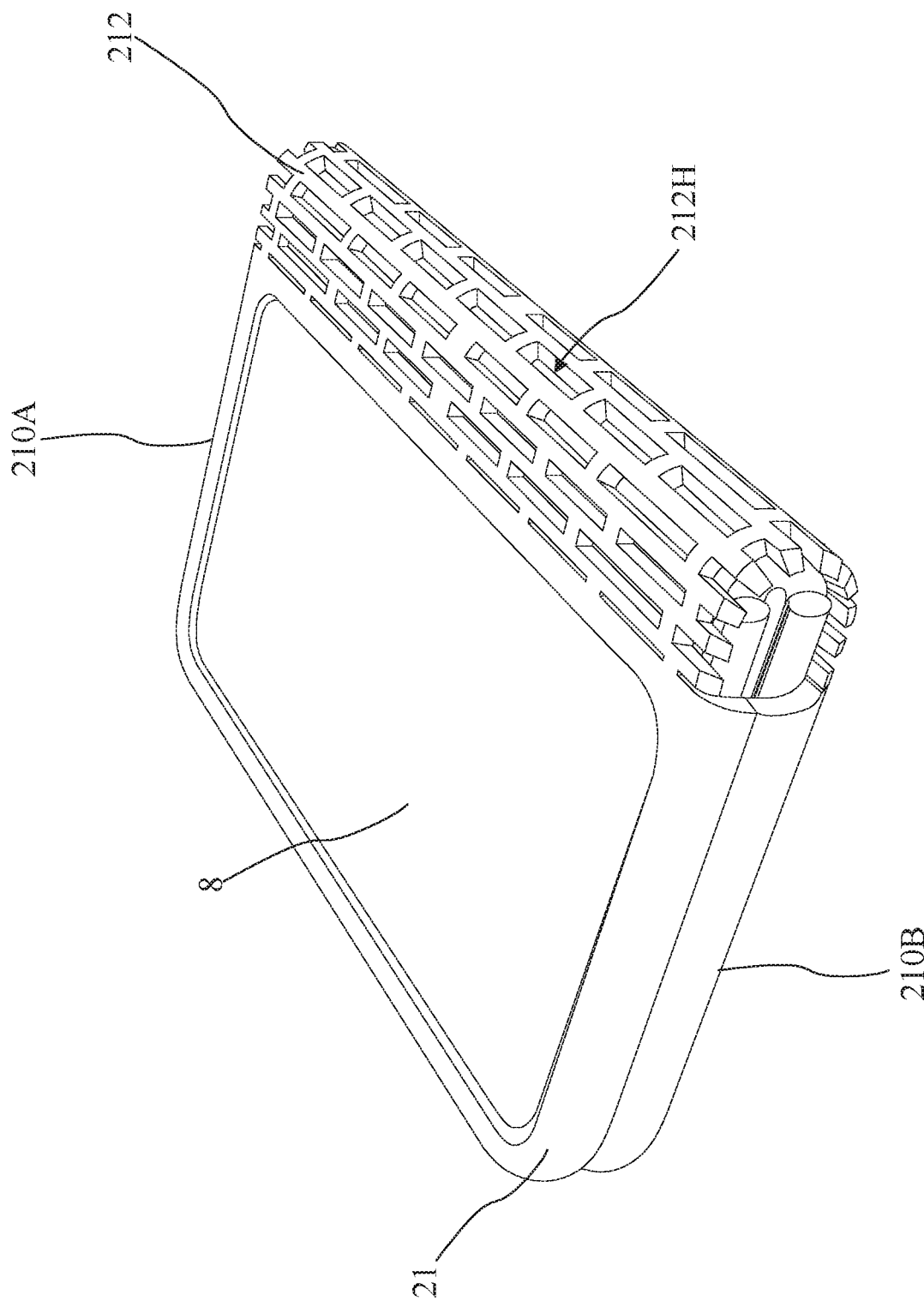

Please refer to FIG. 2A to FIG. 2E. FIG. 2A is a schematic drawing of a foldable apparatus 2 in an unfolded position. FIGS. 2B and 2C are schematic drawings of the foldable apparatus 2 with a foldable device 8 in the unfolded position. FIGS. 2D and 2E are schematic drawings of the foldable apparatus 2 with the foldable device 8 in a folded position.

In some embodiments, the foldable apparatus 2 may include a casing 21, and the casing 21 may include a body 210 and a bending zone 21A. The casing 21 may receive the foldable device 8 (e.g., flexible devices, display devices, flexible panels, electronic devices, mobile, communication devices, or the like). Particularly, the body 210 of the casing 21 may provide an accommodation to receive the foldable device 8.

In some embodiments, the foldable device 8 may be assembled into the foldable apparatus 2 along a direction DIR21. After assembling the foldable device 8 into the foldable apparatus 2, a primary display of the foldable device 9 may face toward a direction DIR22 which is opposite to the direction DIR21.

In some embodiments, the bending zone 21A may be utilized for folding the body 210 from the unfolded position (shown in FIGS. 2B and 2C) to the folded position (shown in FIGS. 2D and 2E), or unfolding the body 210 from the folded position to the unfolded position. In some implementations, the bending zone 21A may correspond to a joint of the foldable device 8 received in the casing 21 so that the body 210 of the casing 21 may be folded or unfolded with the folding operation or unfolding operation of the foldable device 8.

More specifically, in some embodiments, the body 210 may include a first part 210A and a second part 210B. The bending zone 21A may include a stress relaxation structure 212. The stress relaxation structure 212 may connect the first part 210A and the second part 210B. In some implementations, the first part 210A, the second part 210B and the stress relaxation structure 212 may be integrally molded.

When the body 210 is in the folded position, the stress relaxation structure 212 may be used for retaining the body 210 in the folded position. When the body 210 is released from the folded position, the stress relaxation structure 212 may be used for reversing the body 210 to the unfolded position.

In some embodiments, the first part 210A may have a window for exposing a surface (or a secondary display), which is opposite to the primary display, of the foldable device 8. The second part 210B may have a window for exposing a surface (or a secondary display), which is opposite to the primary display, of the foldable device 8. In some implementations, the first part 210A and/or the second 210B may include a frame structure.

In some embodiments, the stress relaxation structure 212 may include a plurality of holes 212H. In some implementations, the holes 212H may be randomly arranged on the stress relaxation structure 212. In some implementations, the holes 212H may be regularly arranged on the stress relaxation structure 212.

Particularly, when the body 210 of the casing 21 is in the folded position, gaps of part of the holes 212H may be expanded. When the body 210 of the casing 21 is in the unfolded position, the gaps of the part of the holes 212H may be shrunk.

In some embodiments, an elongation of the stress relaxation structure 212 may be decreased while the stress applied on the stress relaxation structure 212 is decreased for unfolding the foldable apparatus 2, and gaps of the holes 212H may be shrunk accordingly. The elongation of the stress relaxation structure 212 may be increased while the stress applied on the stress relaxation structure 212 is increased for folding the foldable apparatus 2, and the gaps of the holes 212H may be expanded accordingly.

In other words, the holes 212H may be used for adjusting the compression of the stress relaxation structure 212 of the foldable apparatus 2 during folding, unfolding, and the cyclic action of folding and unfolding.

Figure 2F:
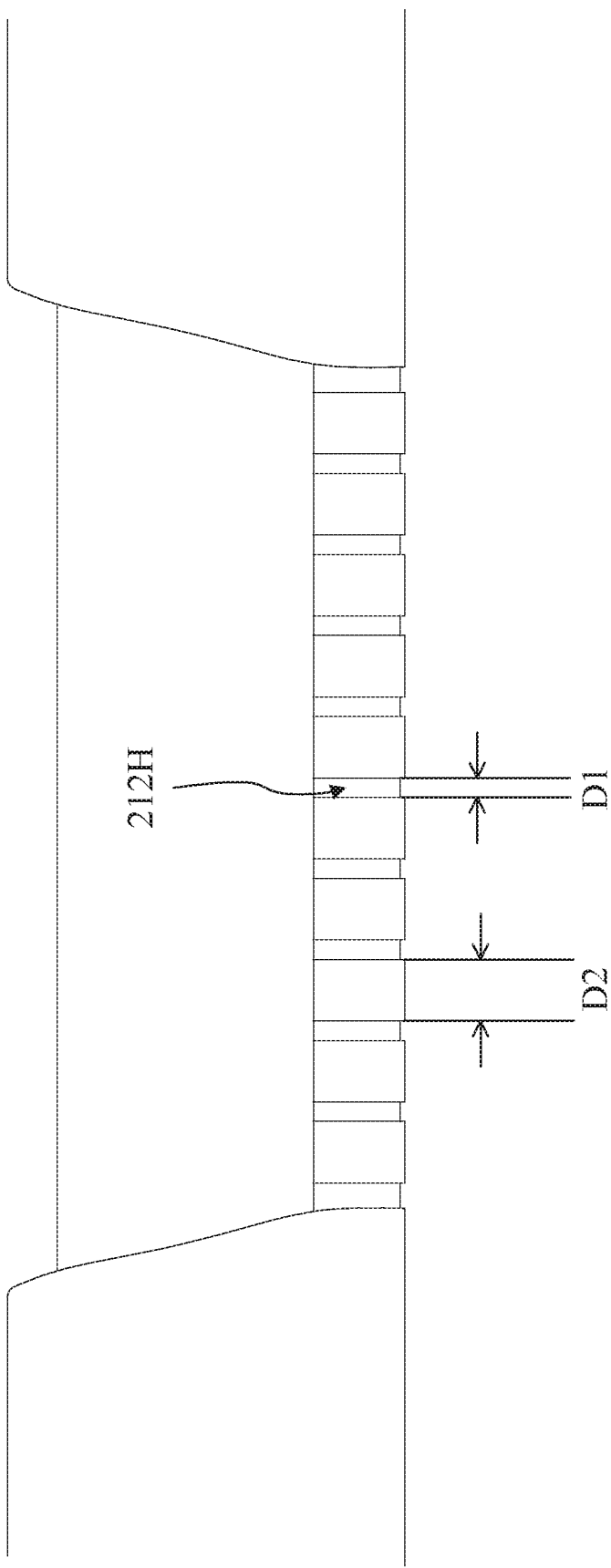
FIG. 2F is a side view of the stress relaxation structure of the foldable apparatus according to some embodiments of the present disclosure.

Referring to FIG. 2F, which is a side view of the stress relaxation structure 212 of the foldable apparatus 2. In some embodiments, when the stress relaxation structure 212 is in the unfolded position, a width D1 of the gap of each holes 212H may be about 0.1 millimeter to 5 millimeter, and a distance D2 between two holes 212H may be about 0.1 millimeter to 5 millimeter.

Figure 2G:
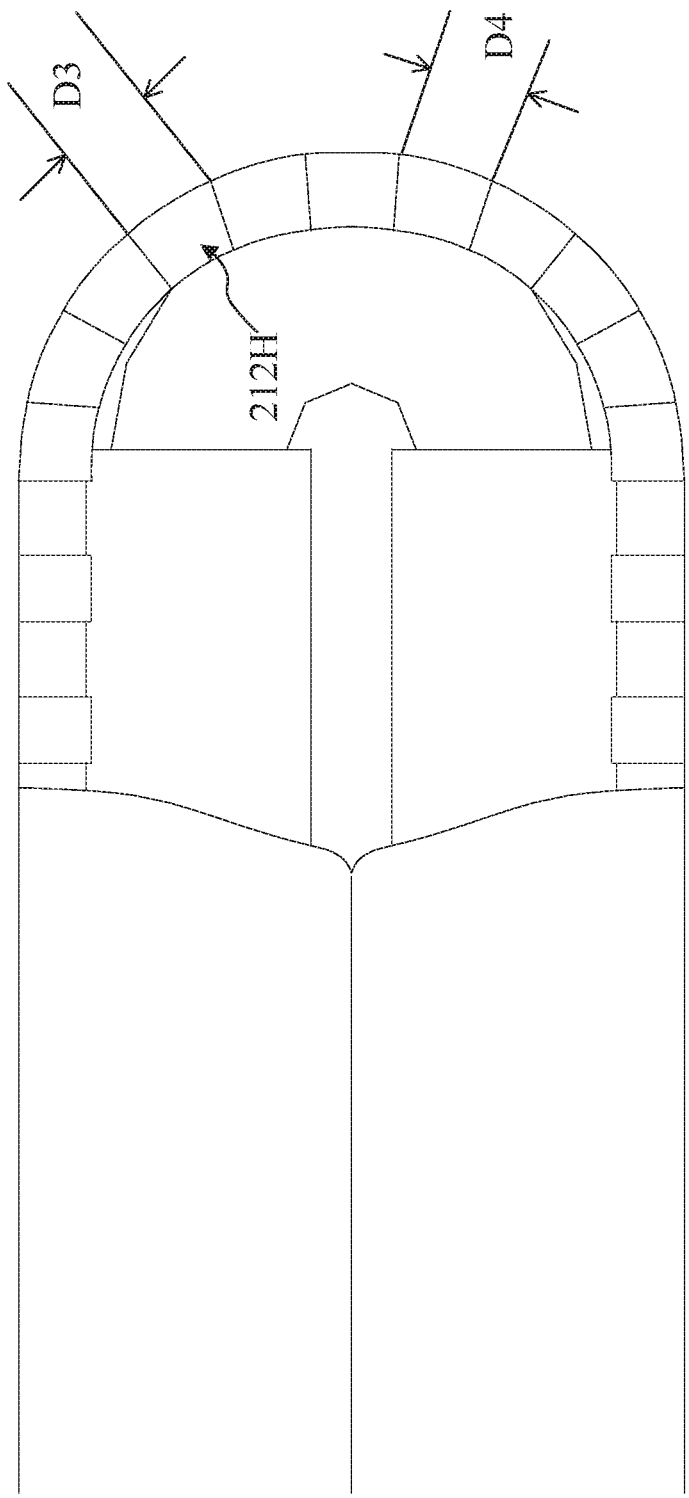
FIG. 2G is a side view of the stress relaxation structure of the foldable apparatus according to some embodiments of the present disclosure.

Referring to FIG. 2G, which is a side view of the stress relaxation structure 212 of the foldable apparatus 2. In some embodiments, when the stress relaxation structure 212 is in the folded position, a width D3 of the gap of each holes 212H may be expended as maximum as about 0.1 millimeter to 5 millimeter, and a distance D4 between two holes 212H may be expended as maximum as about 0.1 millimeter to 5 millimeter.

Figure 3A:
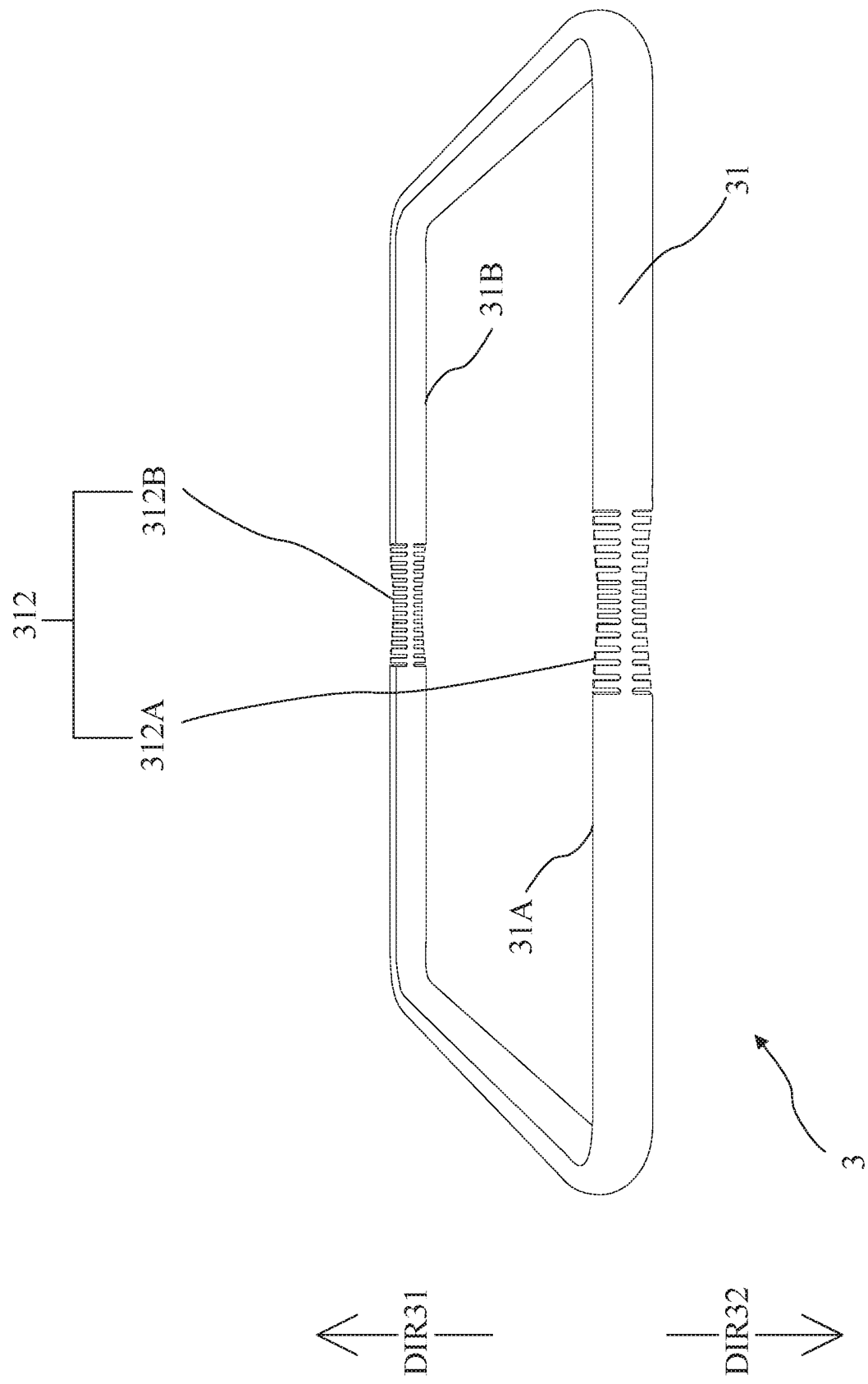
FIG. 3A is a schematic drawing of a foldable apparatus in an unfolded position according to some embodiments of the present disclosure.
Figure 3B:
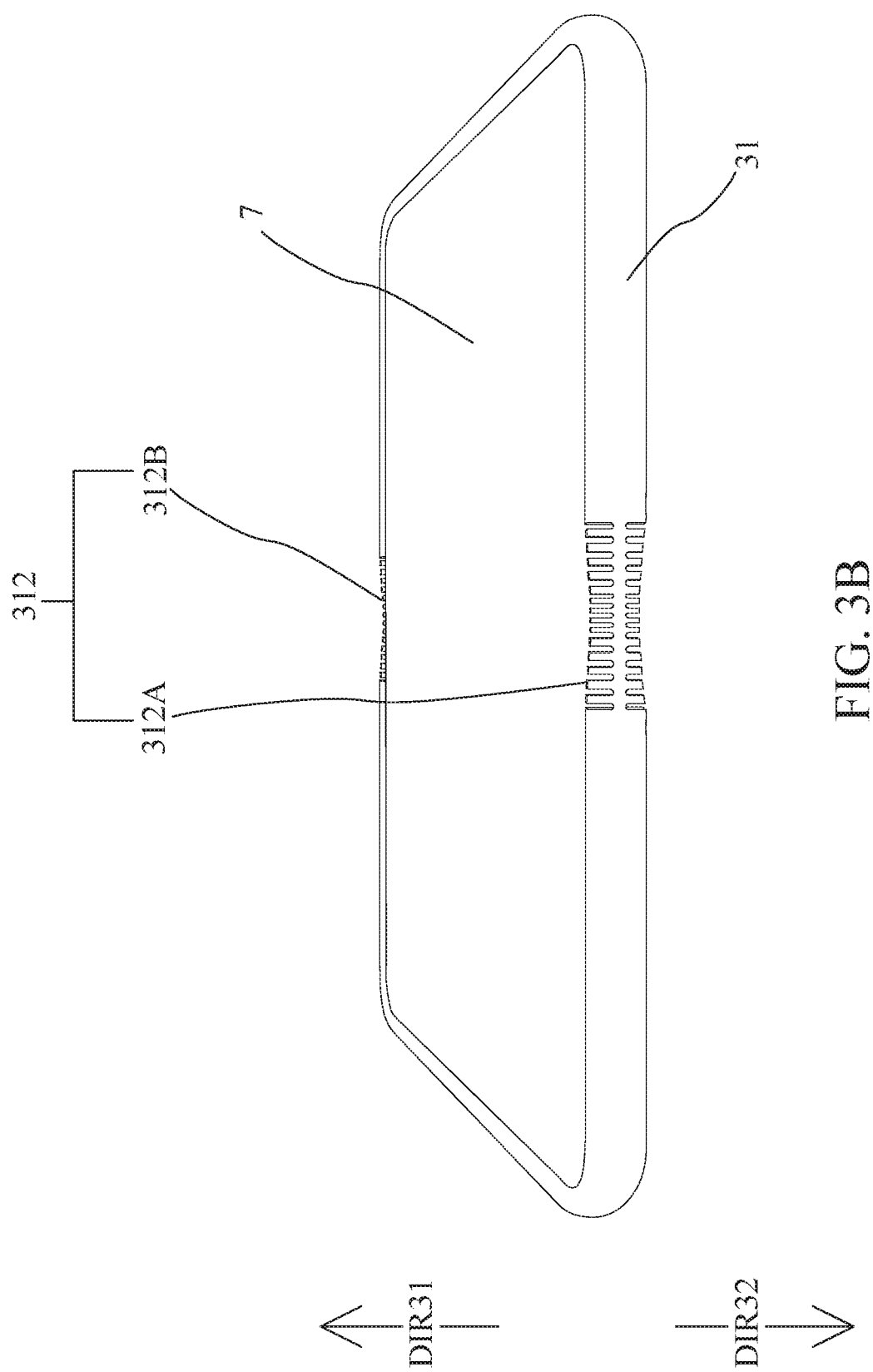
FIGS. 3B to 3C are schematic drawings of the foldable apparatus with a foldable device in an unfolded position according to some embodiments of the present disclosure.
Figure 3C:
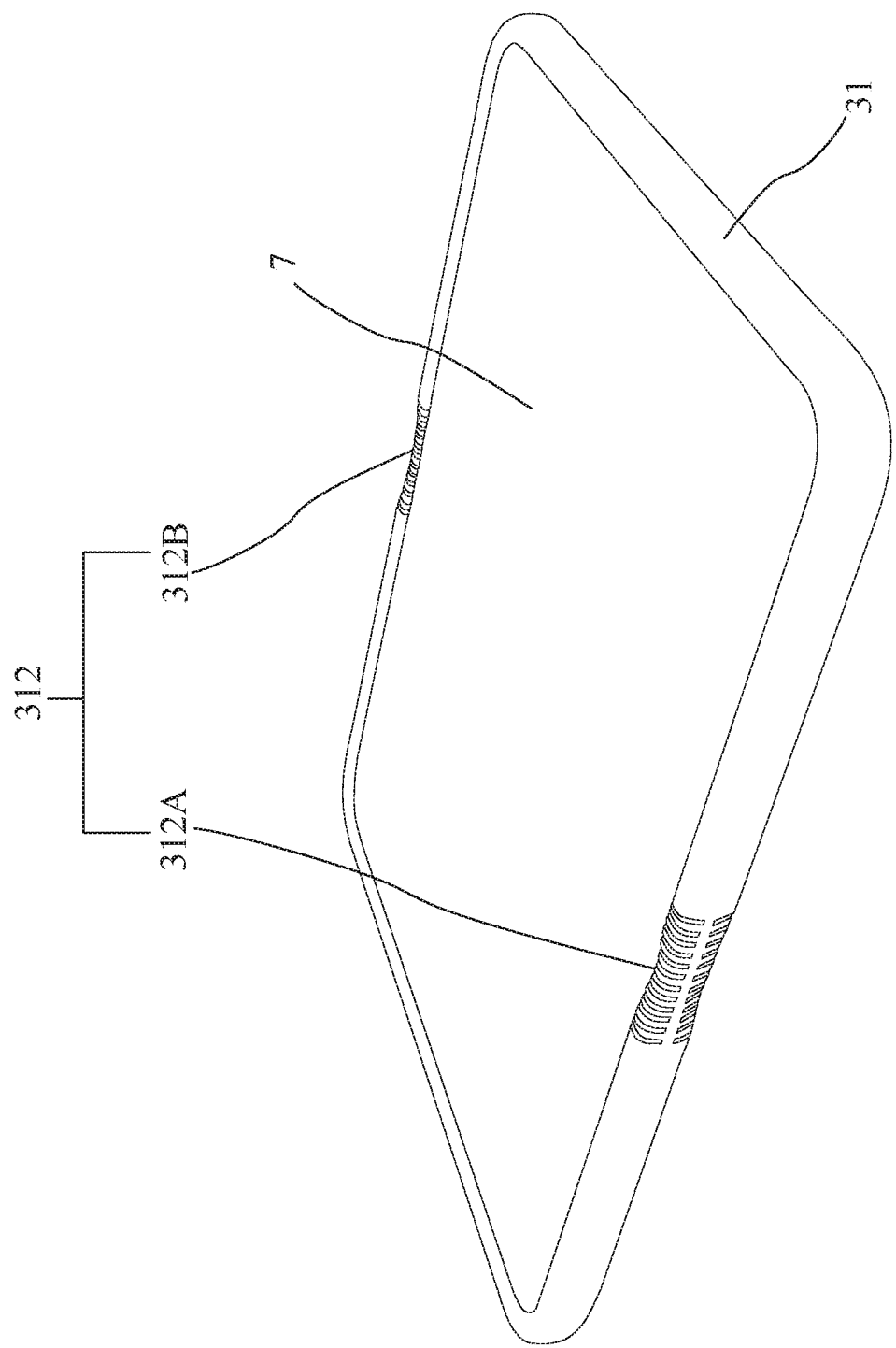
Figure 3D:
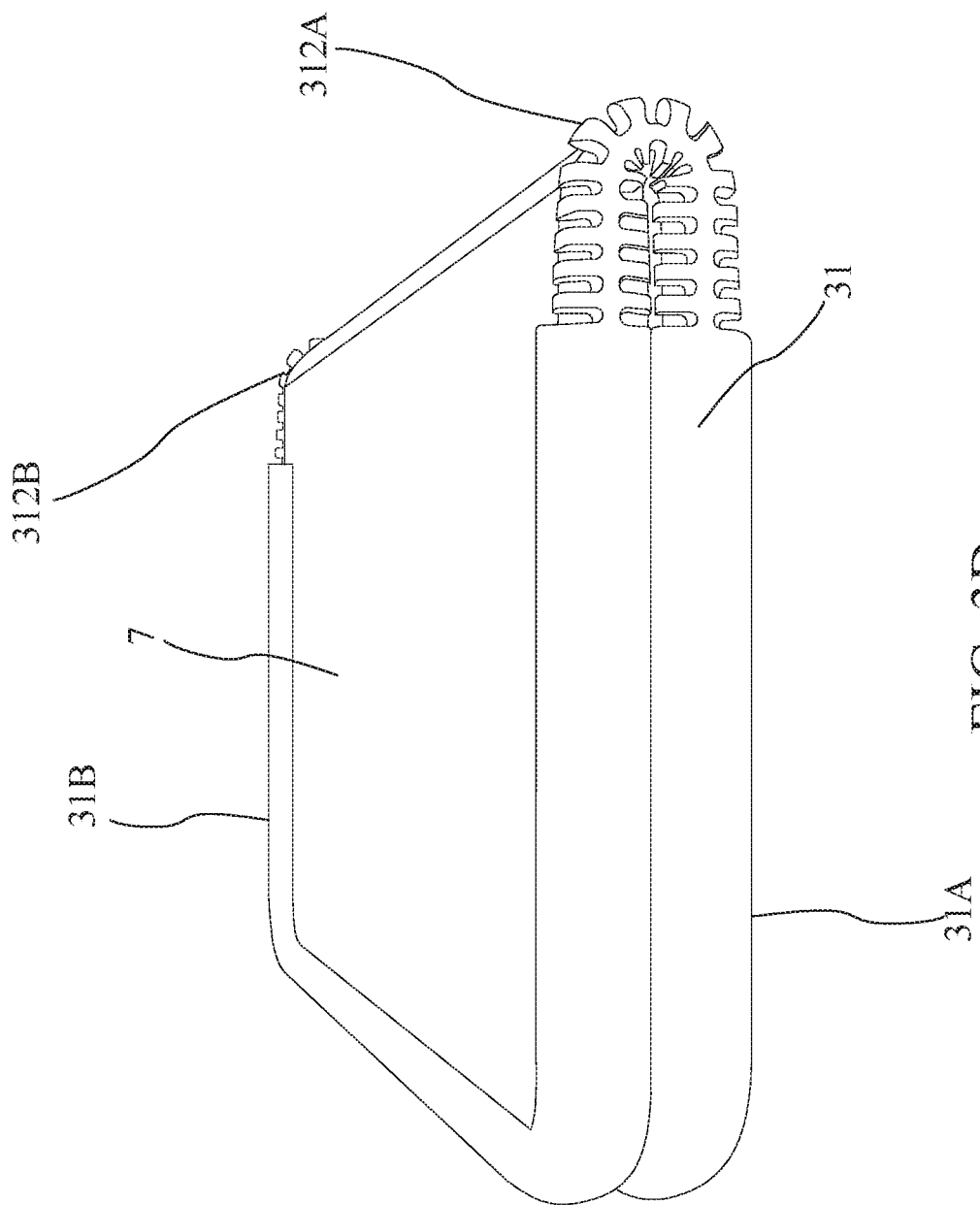
FIGS. 3D to 3E are schematic drawings of the foldable apparatus with the foldable device in a folded position according to some embodiments of the present disclosure.
Figure 3E:
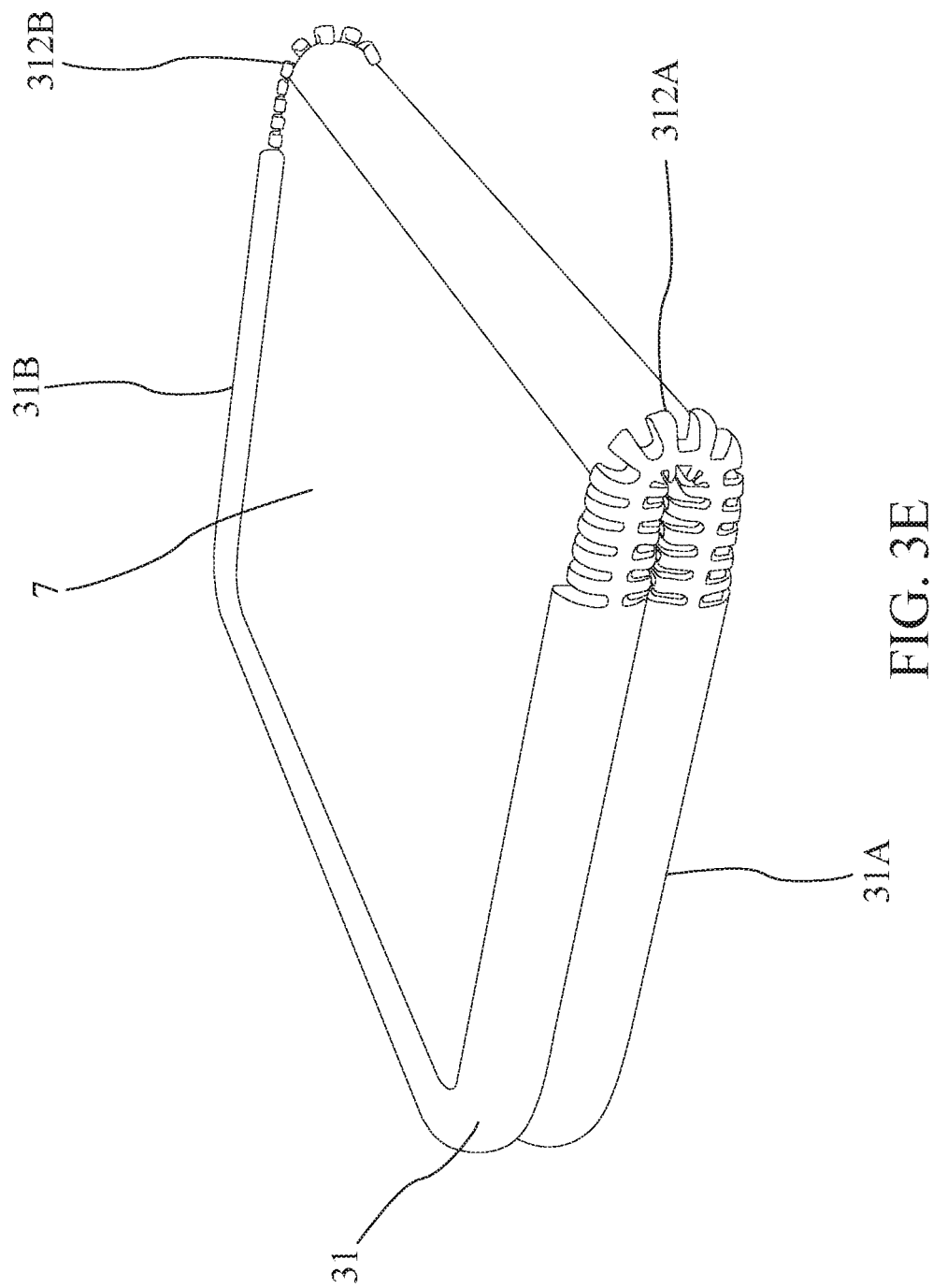

Referring to FIGS. 3A to 3E. FIG. 3A is a schematic drawing of a foldable apparatus 3 in an unfolded position. FIGS. 3B to 3C are schematic drawings of the foldable apparatus 3 with a foldable device 7 in an unfolded position. FIGS. 3D to 3E are schematic drawings of the foldable apparatus 3 with the foldable device 7 in a folded position.

In some embodiments, the foldable apparatus 3 may include a frame 31. The frame 31 may include a flexible structure 312. The frame 31 may receive the foldable device 7 (e.g., flexible devices, display devices, flexible panels, electronic devices, mobile, communication devices, or the like). Particularly, the frame 31 may provide an accommodation to receive the foldable device 7.

In some embodiments, the foldable device 7 may be assembled into the foldable apparatus 3 along a direction DIR31 or a direction DIR 32 which is opposite to the direction DIR 31. In some implementations, after assembling the foldable device 7 into the foldable apparatus 3, a display of the foldable device 7 may face toward the direction DIR31. In some implementations, after assembling the foldable device 7 into the foldable apparatus 3, the display of the foldable device 7 may face toward the direction DIR32.

In some embodiments, the flexible structure 312 may be utilized for folding the frame 31 from the unfolded position (shown in FIGS. 3B and 3C) to the folded position (shown in FIGS. 3D and 3E), or unfolding the frame 31 from the folded position to the unfolded position. In some implementations, the flexible structure 312 may correspond to a joint of the foldable device 7 received in the frame 31 so that the frame 31 may be folded or unfolded with the folding operation or unfolding operation of the foldable device 7.

More specifically, in some embodiments, the frame 31 may include a first part 31A and a second part 31B. The first part 31A may substantially be a half of the frame 31. The second part 31B may substantially be another half of the frame 31.

When the foldable device 7 is received in the frame 31, the first part 31A may correspond to a first portion of the foldable device 7 and the second part 31B may correspond to a second portion of the foldable device 7. The first portion and the second portion of the foldable device 7 may be connected by the joint of the foldable device 7.

The flexible structure 312 may include a first element 312A and a second element 312B. The first element 312A and the second element 312B may connect the first part 31A and the second part 31B. In some implementations, the first part 31A, the second part 31B, the first element 312A and the second element 312B may be integrally molded.

When the frame 31 is in the folded position, the flexible structure 312 may be used for retaining the frame 31 in the folded position. When the frame 31 is released from the folded position, the flexible structure 312 may be used for reversing the frame 31 to the unfolded position.

Figure 3F:
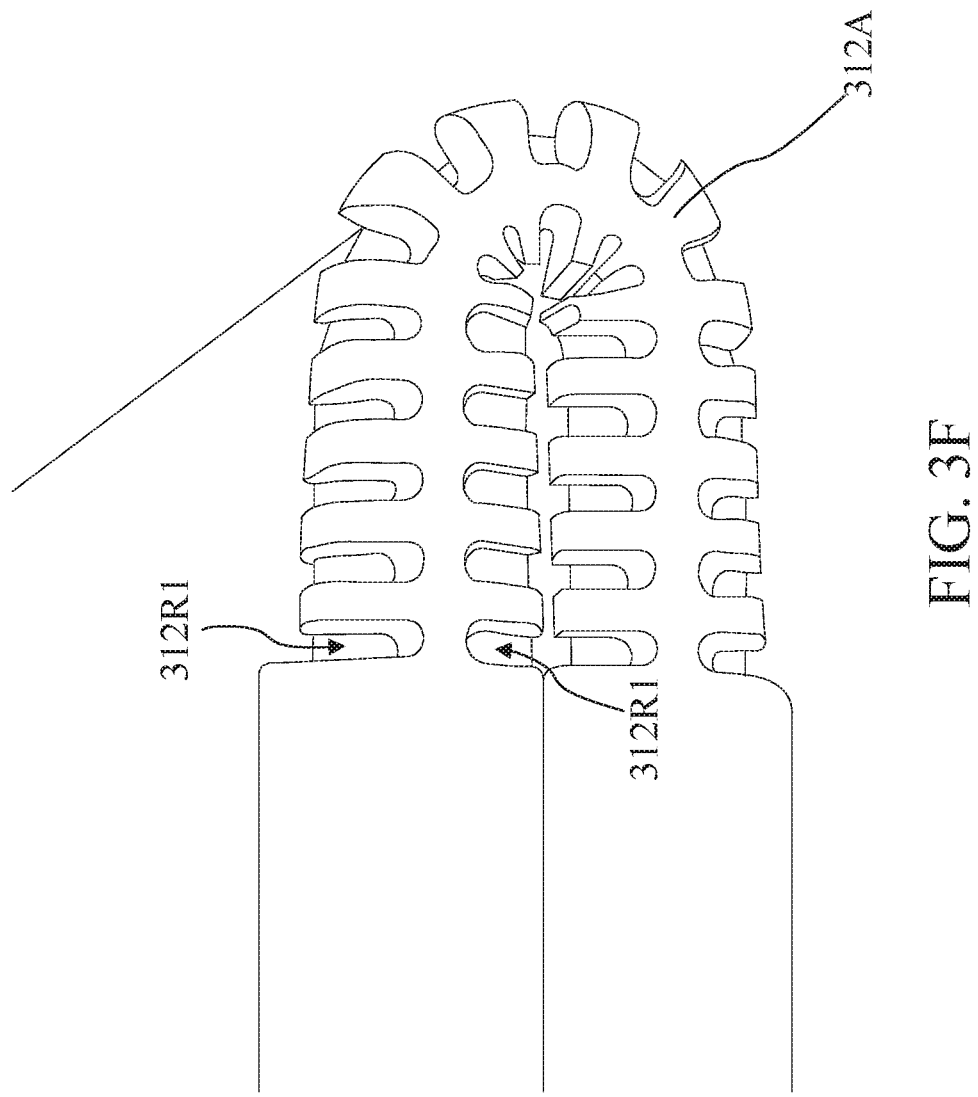
FIGS. 3F to 3G are partial enlargement views of the first element and the second element of the flexible structure according to some embodiments of the present disclosure.
Figure 3G:
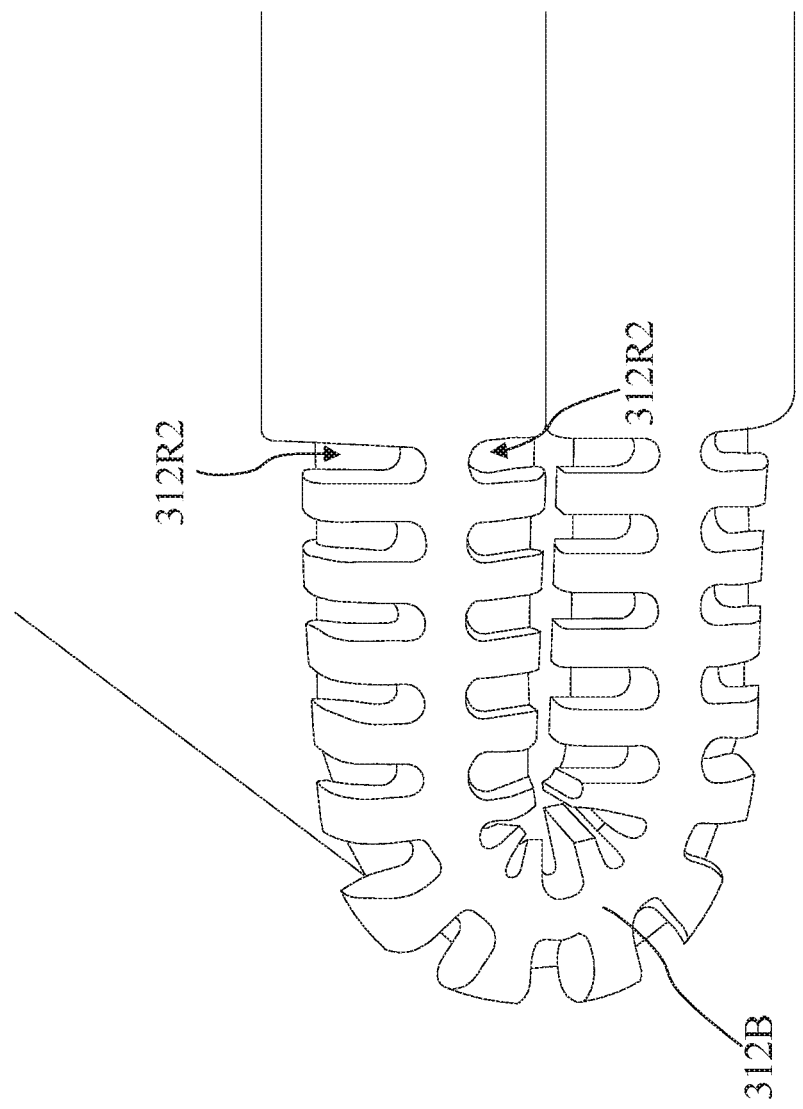

Referring to FIGS. 3F and 3G, which are partial enlargement views of the first element 312A and the second element 312B of the flexible structure 312A. In some embodiments, the first element 312A and the second element 312B may include fishbone structures.

More specifically, a plurality of first recesses 312R1 may be formed on the first element 312A. In some implementations, the plurality of first recesses 312R1 may be formed on two opposite sides of the first element 312A. When the frame 31 is in the unfolded position, one of the opposite sides the first recesses 312R1 formed thereon may face toward the direction DIR31 and the other side the first recesses 312R1 formed thereon may face toward the direction DIR32.

A plurality of second recesses 312R2 may be formed on the second element 312B. In some implementations, the plurality of second recesses 312R2 may be formed on two opposite sides of the second element 312B. When the frame 31 is in the unfolded position, one of the opposite sides the second recesses 312R2 formed thereon may face toward the direction DIR31 and the other side the second recesses 312R2 formed thereon may face toward the direction DIR32.

In some embodiments, an elongation of the flexible structure 312 may be decreased while the stress applied on the flexible structure 312 is decreased for unfolding the foldable apparatus 3. Accordingly, (1) gaps of some recesses 312R1/312R2 on one side of the element 312A/312B may be shrunk; and (2) gaps of some recesses 312R1/312R2 on another side of the element 312A/312B may be expanded.

The elongation of the flexible structure 312 may be increased while the stress applied on the flexible structure 312 is increased for folding the foldable apparatus 3. Accordingly, (1) the gaps of some recesses 312R1/312R2 on one side of the element 312A/312B may be expanded; and (2) the gaps of some recesses 312R1/312R2 on another side of the element 312A/312B may be shrunk.

In other words, the first recesses 312R1 on the first element 312A and the second recesses 312R2 on the second element 312B may be used for adjusting the compression of the flexible structure 312 of the foldable apparatus 3 during folding, unfolding, and the cyclic action of folding and unfolding.

Figure 3H:
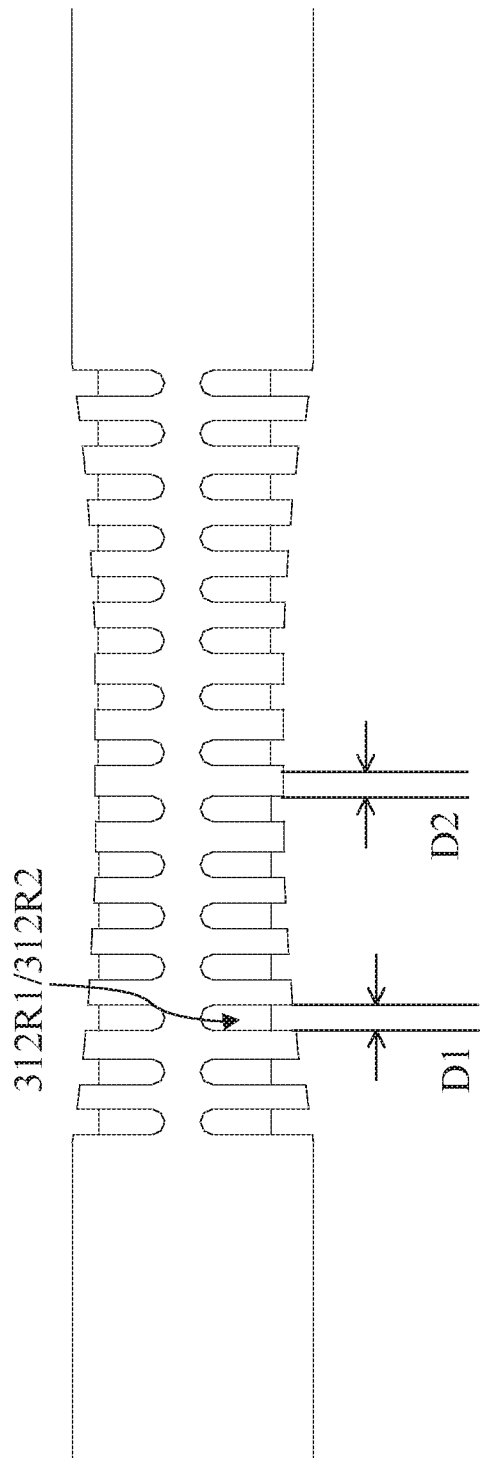
Figure 31:
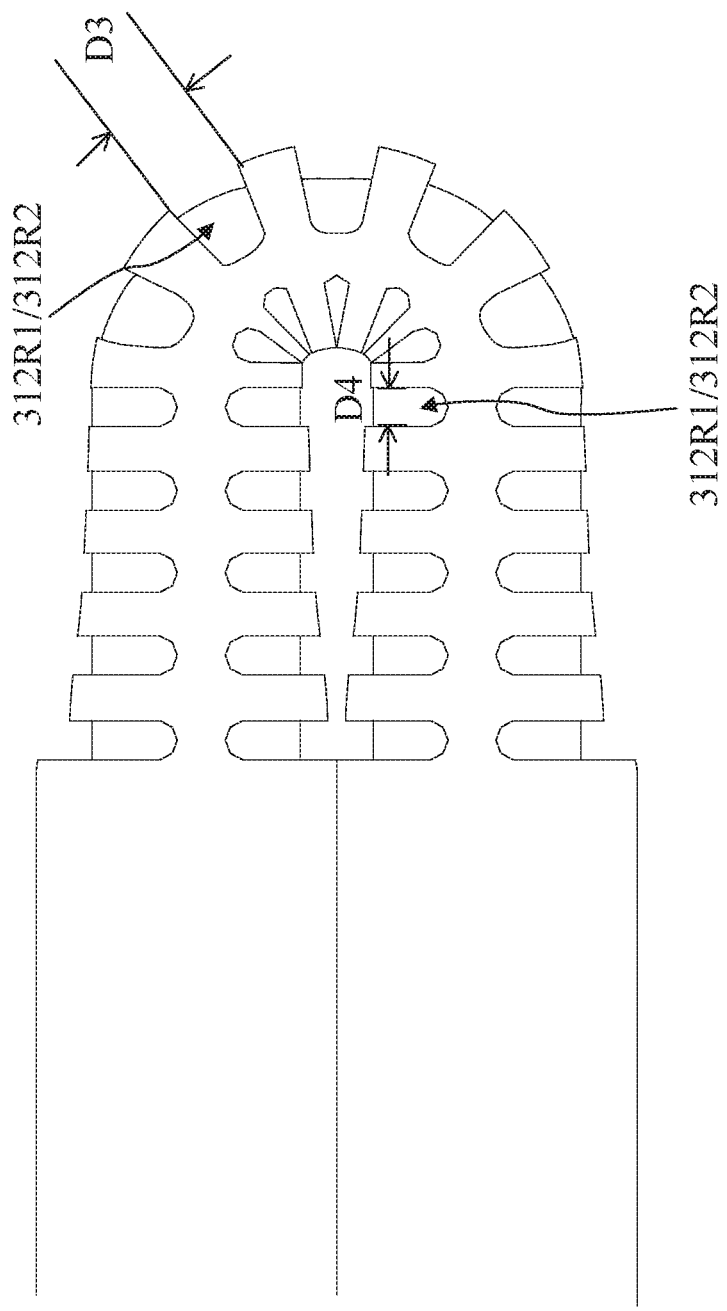

Referring to FIG. 3H, which is a side view of the flexible structure 312 of the foldable apparatus 3. In some embodiments, when the flexible structure 312 is in the unfolded position, a width D1 of the gap of each recesses 312R1/312R2 may be about 0.1 millimeter to 5 millimeter, and a distance D2 between two recesses 312R1/312R2 may be about 0.1 millimeter to 5 millimeter.

Referring to FIG. 3I, which is a side view of the flexible structure 312 of the foldable apparatus 3. In some embodiments, when the flexible structure 312 is in the folded position, a width D3 of the gap of each recesses 312R1/312R2, which face toward outside, may be expended as maximum as about 0.1 millimeter to 5 millimeter, and a width D4 of the gap of each recesses 312R1/312R2, which face toward inside, may be shrunk as minimum as about 0.1 millimeter to 5 millimeter.

Figure 4A:
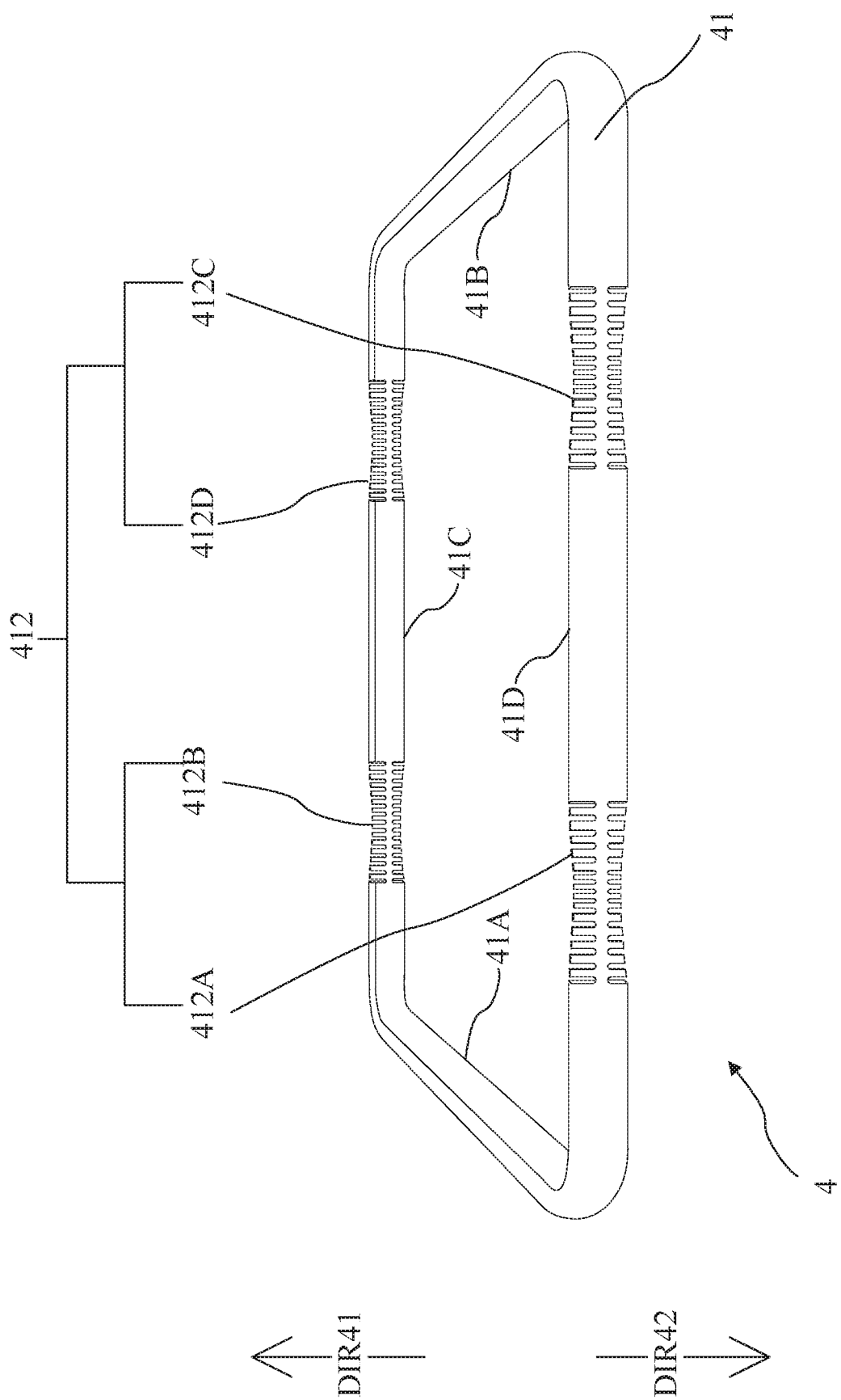
FIG. 4A is a schematic drawing of a foldable apparatus in an unfolded position according to some embodiments of the present disclosure.
Figure 4B:
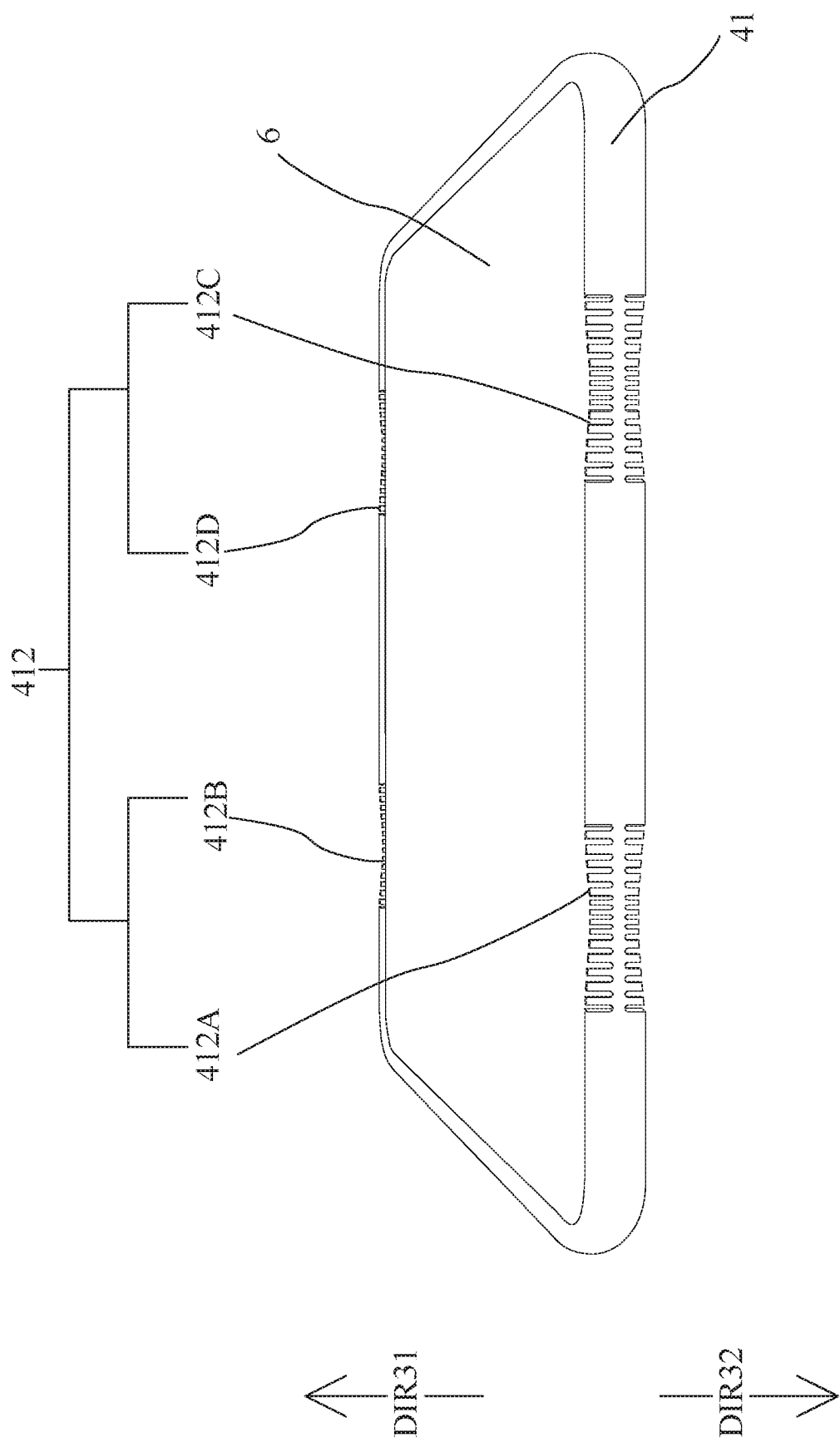
FIG. 4B is a schematic drawing of the foldable apparatus with a foldable device in an unfolded position according to some embodiments of the present disclosure.
Figure 4C:
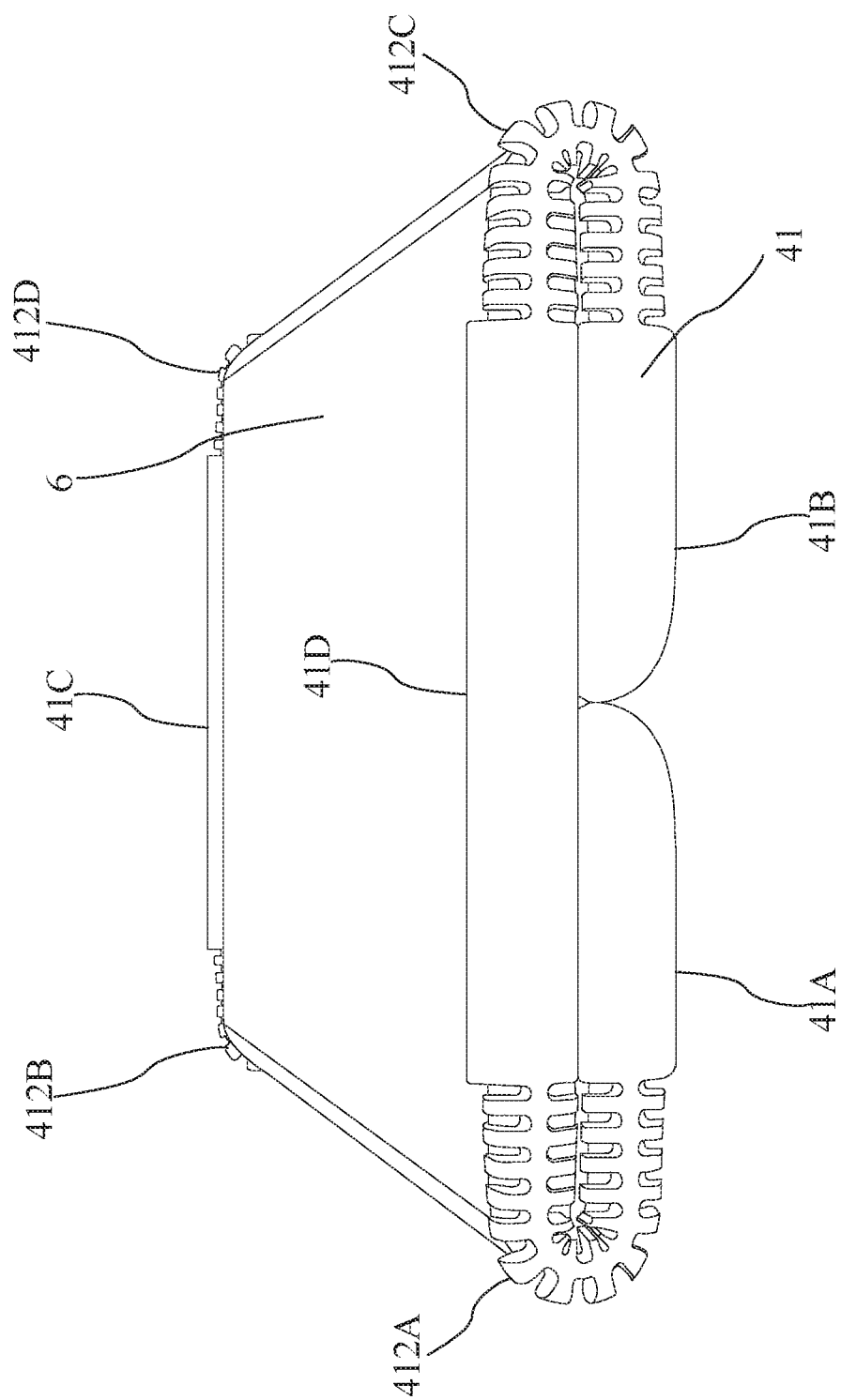
FIG. 4C is a schematic drawing of the foldable apparatus with the foldable device in a folded position according to some embodiments of the present disclosure.

Referring to FIGS. 4A to 4C. FIG. 4A is a schematic drawing of a foldable apparatus 4 in an unfolded position. FIG. 4B is a schematic drawing of the foldable apparatus 4 with a foldable device 6 in an unfolded position. FIG. 4C is a schematic drawing of the foldable apparatus 4 with the foldable device 6 in a folded position.

In some embodiments, the foldable apparatus 4 may include a frame 41. The frame 41 may include a flexible structure 412. The frame 41 may receive the foldable device 6 (e.g., flexible devices, display devices, flexible panels, electronic devices, mobile, communication devices, or the like). Particularly, the frame 41 may provide an accommodation to receive the foldable device 6.

In some embodiments, the foldable device 6 may be assembled into the foldable apparatus 4 along a direction DIR41 or a direction DIR 42 which is opposite to the direction DIR 41. In some implementations, after assembling the foldable device 6 into the foldable apparatus 4, a display of the foldable device 6 may face toward the direction DIR41. In some implementations, after assembling the foldable device 6 into the foldable apparatus 5, the display of the foldable device 6 may face toward the direction DIR42.

In some embodiments, the flexible structure 412 may be utilized for folding the frame 41 from the unfolded position (shown in FIG. 4B) to the folded position (shown in FIG. 4C), or unfolding the frame 41 from the folded position to the unfolded position. In some implementations, the flexible structure 412 may correspond to two joints of the foldable device 6 received in the frame 41 so that the frame 41 may be folded or unfolded with the folding operations or unfolding operations of the foldable device 6.

More specifically, in some embodiments, the frame 41 may include a first part 41A, a second part 41B, a third part 41C and a fourth part 41D. The first part 41A and the second part 41B may substantially be in "C" shape. The third part 41C and the fourth part 41D may substantially be in shape of a bar.

When the foldable device 6 is received in the frame 41, the first part 41A may correspond to a first portion of the foldable device 6 and the second part 41B may correspond to a second portion of the foldable device 6. The first portion may be connected with a third portion by one joint of the foldable device 6. The second portion may be connected with the third portion by the other joint of the foldable device 6.

The flexible structure 412 may include a first element 412A, a second element 412B, a third element 412C and a fourth element 412D. The first element 412A and the second element 412B may connect the first part 41A, the third part 41C and the fourth part 41D. The third element 412C and the fourth element 412D may connect the second part 41B, the third part 41C and the fourth part 41D. In some implementations, the parts 41A to 41D and the elements 412A to 412D may be integrally molded.

When the frame 41 is in the folded position, the flexible structure 412 may be used for retaining the frame 41 in the folded position. When the frame 41 is released from the folded position, the flexible structure 412 may be used for reversing the frame 41 to the unfolded position.

In some embodiments, a material of the above foldable structure may be flexible, such as polymer, rubber, plastic, elastomer, or the like. In some embodiments, a material of the casing/frame may be different from a material of the stress relaxation structure/flexible structure, wherein the hardness of the material of the casing/frame may be different from the hardness of the material of the stress relaxation structure/flexible structure thereof. In some other embodiments, the material of the casing/frame may be identical to the material of the stress relaxation structure/flexible structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A foldable apparatus for receiving a foldable device, comprising:
   a casing for receiving the foldable device, including:
      a body for providing an accommodation to the foldable device; and
      a bending zone for folding the body from an unfolded position to a folded position, including:
         a stress relaxation structure for retaining the body in the folded position and reversing the body to the unfolded position, wherein the stress relaxation structure includes a bellow structure, and the bellow structure includes:
            at least one convex portion; and
            at least one concave portion;
            wherein a thickness of the bellow structure is uniform, the at least one convex portion and the at least one concave portion are connected alternately, and a distance between adjacent convex portions is decreased while unfolding the foldable apparatus, wherein at least one buffer configured on the at least one convex portion and the at least one concave portion is configured to alleviate stress concentration.

2. The foldable apparatus of claim 1, wherein the body includes a first part and a second part, and the stress relaxation structure connects the first part and the second part.

3. The foldable apparatus of claim 2, wherein the first part or the second part has a window for exposing a surface of the foldable device.

4. The foldable apparatus of claim 2, wherein the first part or the second part includes a frame structure.

5. The foldable apparatus of claim 2, wherein the first part, the second part and the stress relaxation structure are integrally molded.

6. A foldable apparatus for receiving a foldable device, comprising:
- a casing for receiving the foldable device, including a first portion and a second portion;
- wherein the first portion of the casing is structured to provide an accommodation to the foldable device, and the second portion is a bending area for the first portion while being folded from an unfolded position to a folded position;
- wherein the second portion is designed to have a stress relaxation structure in order to retain the folded position and reverse the first portion to the unfolded position;
- wherein the stress relaxation structure includes a bellow structure, and the bellow structure includes:
- at least one convex portion; and
- at least one concave portion;
- wherein the at least one convex portion and the at least one concave portion are connected alternately, and a distance between adjacent convex portions is increased while folding the foldable apparatus;
- wherein one of the at least one concave portion has an inner side and an outer side, the inner side faces toward a direction of an accommodation for receiving the foldable device, the outer side faces toward another direction opposite to the direction, and the inner side and the outer side cooperatively form a buffer protruding toward the direction and the buffer is configured to alleviate stress concentration.

\* \* \* \* \*